United States Patent
Kanda

(10) Patent No.: US 7,560,924 B2
(45) Date of Patent: Jul. 14, 2009

(54) MAGNETIC RESONANCE IMAGING APPARATUS AND MAGNETIC RESONANCE IMAGING METHOD

(75) Inventor: Kenichi Kanda, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 12/041,432

(22) Filed: Mar. 3, 2008

(65) Prior Publication Data

US 2008/0218167 A1    Sep. 11, 2008

(30) Foreign Application Priority Data

Mar. 5, 2007    (JP) .............................. 2007-054168

(51) Int. Cl.
*G01V 3/00* (2006.01)
(52) U.S. Cl. ...................................... 324/307; 324/309
(58) Field of Classification Search ......... 324/300–322; 600/407–445; 128/653; 364/413.13
See application file for complete search history.

(56) References Cited

U.S. PATENT DOCUMENTS

| | | | |
|---|---|---|---|
| 4,715,383 A | 12/1987 | Ehman et al. | |
| 4,728,890 A | 3/1988 | Pattany et al. | |
| 4,994,744 A | 2/1991 | Glover et al. | |
| 5,148,035 A | 9/1992 | Hattori et al. | |
| 5,159,550 A | 10/1992 | Sakamoto et al. | |
| 5,251,128 A | 10/1993 | Crawford | |
| 5,287,276 A | 2/1994 | Crawford et al. | |
| 5,341,099 A * | 8/1994 | Suzuki ....................... | 324/309 |
| 6,469,505 B1 * | 10/2002 | Maier et al. ................. | 324/309 |
| 6,528,998 B1 * | 3/2003 | Zhou et al. .................. | 324/309 |
| 7,332,911 B2 | 2/2008 | Iwadate et al. | |
| 2007/0120565 A1 | 5/2007 | Iwadate et al. | |

FOREIGN PATENT DOCUMENTS

| | | |
|---|---|---|
| JP | 10-277010 | 10/1998 |
| JP | 2006-026076 | 2/2006 |

* cited by examiner

*Primary Examiner*—Brij B Shrivastav
(74) *Attorney, Agent, or Firm*—Armstrong Teasdale LLP

(57) ABSTRACT

A magnetic resonance imaging apparatus has a controller which controls an operation of a scan section in such a manner that the scan section executes a scan in an imaging sequence, based on the imaging sequence condition set so as to correspond to a slice tracking method by an imaging sequence condition setting unit, and controls the operation of at least one of the scan section and an image reconstruction unit, based on a phase difference calculated by a phase difference calculation unit so as to eliminate the phase difference at which phases of the magnetic resonance signals produced in an imaging slice areas change, when an RF pulse subsequent to having been adjusted in frequency so as to the slice tracking method is transmitted upon execution of the scan in the imaging sequence.

20 Claims, 13 Drawing Sheets

MAGNETIC RESONANCE IMAGING APPARATUS AND MAGNETIC RESONANCE IMAGING METHOD

CROSS REFERENCE TO RELATED APPLICATIONS

This application claims the benefit of Japanese Patent Application No. 2007-054168 filed Mar. 5, 2007.

BACKGROUND OF THE INVENTION

The field of the present invention relates to a magnetic resonance imaging (MRI) apparatus and a magnetic resonance imaging method and, more particularly, to a magnetic resonance imaging apparatus and a magnetic resonance imaging method in which a subject is scanned in accordance with an imaging sequence for applying an RF pulse to each of imaging slice areas in a static magnetic field space in which the imaging slice areas each include an imaging target body-moved at the subject are accommodated or held, and acquiring magnetic resonance signals produced from the imaging slice areas as imaging data, and thereafter image reconstruction processing is executed on the imaging data acquired by scanning the subject in the imaging sequence, thereby reconstructing images of the imaging slice areas.

A magnetic resonance imaging apparatus has been used in various fields such as a medical field, an industrial field, etc.

The magnetic resonance imaging apparatus includes an imaging space formed with a static magnetic field. Each imaging slice area including a target for imaging at a subject is accommodated or held in the imaging space. Thus, spins of proton in the imaging slice area are arranged in the direction of the static magnetic field to obtain magnetization vectors thereof. Thereafter, an RF pulse is transmitted to each imaging slice area of the subject in the imaging space formed with the static magnetic field to generate a nuclear magnetic resonance (NMR) phenomenon, thereby flipping the magnetization vectors of the spins. Then, magnetic resonance (MR) signals generated when the magnetization vectors of the flipped spins are returned in an original static magnetic-field direction, are acquired. Thus, the subject is scanned in accordance with an imaging sequence for imaging the imaging slice areas to acquire the magnetic resonance signals as imaging data. The subject is scanned in accordance with, for example, an imaging sequence such as a spin echo method, a gradient recalled echo method or the like. Then, image reconstruction processing is effected on magnetic resonance signals acquired as imaging data by execution of this scan to generate slice images about imaging slice areas of the subject.

There may be cases in which when the subject is scanned using the magnetic resonance imaging apparatus in this way to generate the slice images, body motion artifacts occur in the generated slice images where an imaging target is body-moved and its position is displaced from a reference position. Since each internal tissue is moved due to a breathing exercise and heartbeat motion or the like where, for example, a region such as a cardiac region of the subject, an abdominal region thereof or the like is imaged, body motion artifacts may occur noticeably and image quality may be deteriorated.

In order to prevent deterioration of the image quality due to the occurrence of the body motion artifacts, a method of monitoring the body motion has been proposed that is based on the breathing exercise or the heartbeat motion or the like, such that a scan is executed in sync with the body motion (refer to, for example, Japanese Unexamined Patent Publication No. Hei 10(1998)-277010).

Further, there has been proposed a slice tracking method for monitoring body motion at the execution of a scan, calculating the position of an imaging target body-moved from a reference position and thereafter adjusting an imaging sequence condition in such a manner that each magnetic resonance signal is acquired from its corresponding imaging slice area including the body-moved imaging target. Here, for example, the frequency of each RF pulse is adjusted from a reference frequency, based on the result of calculation of the position of the imaging target body-moved from the reference position, followed by its transmission. For instance, each receive frequency and phase are adjusted. Thus, the slice tracking method adjusts various parameters starting with the frequency of the RF pulse and sets an imaging sequence condition (refer to, for example, Japanese Unexamined Patent Publication No. 2006-26076). Patent Document 1. Japanese Unexamined Patent Publication No. Hei 10(1998)-277010.

In the case of this method, the acquired imaging data are not selected as the raw data where the diaphragm varies greatly and its position is beyond the acceptance window. When the diaphragm is small in variation, the acquired imaging data is selected as the raw data and each slice image is reconstructed. It is, therefore, possible to prevent the occurrence of body motion artifacts in each image-reconstructed slice image. In this method, however, ones unselected as the raw data exist in the acquired imaging data. Therefore, the scan time may become long and hence imaging may not be carried out efficiently.

On the other hand, in the latter method, an imaging sequence is executed following a navigator sequence after execution of the navigator sequence in a manner similar to the above in order to monitor the breathing exercise of a subject, for example. Here, the position of each imaging slice area including an imaging target, moved upon the execution of the imaging sequence is determined based on the position of the diaphragm calculated as described above by execution of the navigator sequence. Thereafter, the frequency or the like of each RF pulse transmitted in the imaging sequence is adjusted and the RF pulse subsequent to having been adjusted in frequency is transmitted, thereby scanning the subject so as to correspond to the moved imaging slice area.

Therefore, since this method yields the absence of the imaging data unselected as the raw data, the scan time becomes short as compared with the former method, thereby making it possible to execute imaging efficiently.

In the latter slice tracking method, however, when the RF pulse subsequent to having been adjusted in frequency so as to correspond to each imaging slice area displaced from the reference position due to the body motion is transmitted upon execution of the scan in the imaging sequence, the phase of the magnetic resonance signal produced in each imaging slice area moved from the reference position may be different from that of the magnetic resonance signal produced at the reference position. Thus, there may be a case in which a phase difference occurs between the two. Therefore, when the subject is scanned in accordance with the imaging sequence for transmitting the RF pulse subsequent to having been adjusted in frequency, and image reconstruction processing is executed on the acquired or collected imaging data, ghosts occur in the reconstructed images, so image quality may be deteriorated. This malfunction comes to the surface because the above phase difference becomes larger as the imaging slice area is greatly displaced from the reference position due to the body motion.

Such a malfunction further comes to the surface depending on a delay time and an error in phase at the transmission of the RF pulse, and the conditions of hardware in addition to this.

Since the ghosts occur upon execution of the imaging by the slice tracking method in this way, an improvement in image quality may become difficult.

SUMMARY OF THE INVENTION

In a first aspect, there is provided a magnetic resonance imaging apparatus of the invention, including a scan section which includes a static magnetic field space in which imaging slice areas each including an imaging target body-moved at a subject are accommodated, and scans the subject in accordance with an imaging sequence for applying RF pulses to the imaging slice areas accommodated in the static magnetic field space to acquire magnetic resonance signals produced from the imaging slice areas as imaging data. The apparatus also includes an image reconstruction unit which executes image reconstruction processing on the imaging data acquired by allowing the scan section to execute the scan in the imaging sequence, thereby reconstructing images of the imaging slice areas, a position calculation unit which determines a position where the imaging target is body-moved, and a controller which controls operations of the scan section and the image reconstruction unit, based on the position of the imaging target, which is determined by the position calculation unit. The controller includes an imaging sequence condition setting unit which sets an imaging sequence condition at the time that the scan section executes the scan in the imaging sequence, so as to correspond to a slice tracking method for adjusting at least the frequency of each RF pulse applied in the imaging sequence, based on the position of the imaging target calculated by the position calculation unit, thereby changing the position of each imaging slice area, in such a manner that the imaging data are acquired from the body-moved imaging target when the scan section executes the scan in the imaging sequence. The controller also includes a phase difference calculation unit which calculates a phase difference at which the phases of the magnetic resonance signals produced in the imaging slice areas change, when the RF pulse subsequent to having been adjusted in frequency so as to correspond to the position of the imaging target by the imaging sequence condition setting unit is transmitted upon execution of the scan in the imaging sequence. The controller controls the operation of the scan section in such a manner that the scan section executes the scan in the imaging sequence based on the imaging sequence condition set so as to correspond to the slice tracking method by the imaging sequence condition setting unit, and controls the operation of at least one of the scan section and the image reconstruction unit, based on the phase difference calculated by the phase difference calculation unit so as to eliminate the phase difference at which the phases of the magnetic resonance signals produced in the imaging slice areas change when the RF pulse subsequent to having been adjusted in frequency so as to the slice tracking method is transmitted upon execution of the scan in the imaging sequence.

The controller further includes a preparation sequence condition setting unit which sets a preparation sequence condition at which the scan section executes a preparation sequence, in such a manner that execution of scans in the preparation sequence including a first preparation sequence for transmitting an RF pulse to a first slice area of the subject at a first frequency in the static magnetic field space and acquiring a magnetic resonance signal produced from the first slice area as first preparation data, and a second preparation sequence for transmitting an RF pulse of a second frequency different from the first frequency so as to acquire a magnetic resonance signal from a second slice area located at a position different from the first slice area as viewed in a slice-axis direction of the first slice area at the subject and acquiring the magnetic resonance signal produced from the second slice area as second preparation data is performed before the execution of the scan in the imaging sequence. The controller also controls the operation of the scan section in such a manner that the subject is scanned by execution of the preparation sequence by the scan section, based on the preparation sequence condition set by the preparation sequence condition setting unit, and the phase difference calculation unit calculates the phase difference, based on the first preparation data and the second preparation data respectively acquired by allowing the scan section to execute the scans.

Preferably, the imaging sequence condition setting unit sets the imaging sequence condition, based on the phase difference calculated by the phase difference calculation unit in such a way as to eliminate a phase difference at which the phase of the magnetic resonance signal produced in each imaging slice area changes, when the RF pulse subsequent to having been adjusted in frequency so as to correspond to the slice tracking method is transmitted upon execution of the scan in the imaging sequence.

Preferably, when the imaging sequence condition is set, the imaging sequence condition setting unit adjusts the phase of each RF pulse transmitted upon execution of the imaging sequence, based on the phase difference calculated by the phase difference calculation unit.

Preferably, the imaging sequence condition setting unit sets the imaging sequence condition in such a manner that the scan section adjusts the phase of the imaging data and acquires the so-adjusted imaging data upon execution of the imaging sequence, based on the phase difference calculated by the phase difference calculation unit.

Preferably, after the image reconstruction unit corrects the phase of the imaging data, based on the phase difference calculated by the phase difference calculation unit so as to eliminate the phase difference at which the phase of each magnetic resonance signal acquired when the RF pulse subsequent to having been adjusted in frequency so as to correspond to the slice tracking method is transmitted upon execution of the scan in the imaging sequence, changes, the controller controls the operation of the image reconstruction unit to execute the image reconstruction processing.

Preferably, the position calculation unit calculates the position of the imaging target body-moved by a breathing exercise of the subject.

Preferably, the preparation sequence condition setting unit sets the preparation sequence condition in such a manner that a navigation sequence for acquiring magnetic resonance signals produced in an area containing a diaphragm at the subject as navigator echo data is contained in the preparation sequence, and the position calculation unit calculates the position of the imaging target, based on the navigator echo data acquired by allowing the scan section to scan the subject in accordance with the preparation sequence corresponding to the preparation sequence condition set by the preparation sequence condition setting unit.

Preferably, the preparation sequence condition setting unit sets the preparation sequence condition in such a manner that a pulse sequence free of transmission of a phase encode gradient pulse is brought to the preparation sequence at the imaging sequence set by the imaging sequence condition setting unit.

Preferably, the preparation sequence condition setting unit sets the preparation sequence condition in such a manner that the magnetic resonance signals are respectively acquired from a plurality of the second slice areas different in position as viewed in the slice-axis direction of the first slice area at the subject as the second preparation data in the second preparation sequence.

Preferably, the phase difference calculation unit executes a one-dimensional Fourier transform process on the first preparation data and the second preparation data thereby to calculate projection images of the first and second slice areas and calculates the phase difference, based on the phases of the calculated projection images.

In a second aspect, there is provided a magnetic resonance imaging method of the invention which scans a subject in accordance with an imaging sequence for applying RF pulses to imaging slice areas each including an imaging target body-moved at the subject, in a static magnetic field space in which the imaging slice areas are accommodated, and acquiring magnetic resonance signals produced from the imaging slice areas as imaging data, and thereafter executes image reconstruction processing on the imaging data acquired by execution of the scan in the imaging sequence, thereby reconstructing images of the imaging slice areas. The magnetic resonance imaging method includes setting a preparation sequence condition at execution of a preparation sequence in such a manner that execution of scans in the preparation sequence including a first preparation sequence for transmitting an RF pulse to a first slice area of the subject at a first frequency in the static magnetic field space and acquiring a magnetic resonance signal produced from the first slice area as first preparation data, and a second preparation sequence for transmitting an RF pulse of a second frequency different from the first frequency so as to acquire a magnetic resonance signal from a second slice area located at a position different from the first slice area as viewed in a slice-axis direction of the first slice area at the subject and acquiring the magnetic resonance signal produced from the second slice area as second preparation data is performed before the execution of the scan in the imaging sequence. The method also includes determining a position where the imaging target is body-moved, and setting an imaging sequence condition at the time that the scan is executed in the imaging sequence, so as to correspond to a slice tracking method for adjusting at least the frequency of each RF pulse applied in the imaging sequence, based on the position of the imaging target calculated by the position calculation step and thereby changing the position of each imaging slice area, in such a manner that the imaging data are acquired from the body-moved imaging target when the scan is executed in the imaging sequence. Setting the imaging sequence condition includes calculating a phase difference at which the phases of the magnetic resonance signals produced in the imaging slice areas change, based on the first preparation data and the second preparation data acquired by execution of the scan in the imaging sequence, when the RF pulse subsequent to having been adjusted in frequency so as to correspond to the slice tracking method is transmitted upon execution of the scan in the imaging sequence. Moreover, the imaging sequence condition is set based on the calculated phase difference, so as to eliminate the phase difference at which the phases of the magnetic resonance signals produced in the imaging slice areas change, when the RF pulse subsequent to having been adjusted in frequency is transmitted upon execution of the scan in the imaging sequence.

Setting the imaging sequence condition includes adjusting the phase of each RF pulse transmitted upon execution of the imaging sequence based on the phase difference calculated by the phase difference calculation step when the imaging sequence condition is set.

Moreover, the imaging sequence condition is set based on the calculated phase difference in such a manner that upon execution of the imaging sequence, the phase of the imaging data is adjusted and the so-adjusted imaging data is acquired.

Preferably, the position of the imaging target body-moved by a breathing exercise of the subject is calculated at the position calculation step.

The preparation sequence condition is set in such a manner that a navigation sequence for acquiring magnetic resonance signals produced in an area containing a diaphragm at the subject as navigator echo data is contained in the preparation sequence, and the position of the imaging target is determined based on the navigator echo data acquired by scanning the subject in accordance with the preparation sequence corresponding to the preparation sequence condition set by the preparation sequence condition setting step.

Moreover, the preparation sequence condition is set in such a manner that a pulse sequence free of transmission of a phase encode gradient pulse is brought to the preparation sequence at the imaging sequence set by the imaging sequence condition setting step.

Further, the preparation sequence condition is set in such a manner that the magnetic resonance signals are respectively acquired from a plurality of the second slice areas different in position as viewed in the slice-axis direction of the first slice area at the subject as the second preparation data in the second preparation sequence.

Calculating the phase difference includes executing a one-dimensional Fourier transform process on the first preparation data and the second preparation data to calculate projection images of the first and second slice areas, and the phase difference is calculated based on the phases of the calculated projection images.

In a third aspect, there is provided a magnetic resonance imaging method which scans a subject in accordance with an imaging sequence by applying RF pulses to imaging slice areas each including an imaging target body-moved at the subject, in a static magnetic field space in which the imaging slice areas are accommodated, and acquiring magnetic resonance signals produced from the imaging slice areas as imaging data, and thereafter executing image reconstruction processing on the imaging data acquired by execution of the scan in the imaging sequence, thereby reconstructing images of the imaging slice areas. The magnetic resonance imaging method includes setting a preparation sequence condition at execution of a preparation sequence in such a manner that execution of scans in the preparation sequence each include a first preparation sequence for transmitting an RF pulse to a first slice area of the subject at a first frequency in the static magnetic field space and acquiring a magnetic resonance signal produced from the first slice area as first preparation data, and a second preparation sequence for transmitting an RF pulse of a second frequency different from the first frequency so as to acquire a magnetic resonance signal from a second slice area located at a position different from the first slice area as viewed in a slice-axis direction of the first slice area at the subject and acquiring the magnetic resonance signal produced from the second slice area as second preparation data is performed before the execution of the scan in the imaging sequence. The method also includes determining a position where the imaging target is body-moved, setting an imaging sequence condition at the time that the scan is executed in the imaging sequence, so as to correspond to a slice tracking method for adjusting at least the frequency of each RF pulse applied in the imaging sequence based on the position of the imaging target calculated by the position calculation step and thereby changing the position of each imaging slice area, in such a manner that the imaging data are acquired from the body-moved imaging target when the scan is executed in the imaging sequence. The method also includes executing an image reconstruction process on the imaging data acquired by the scan executed on the subject in the imaging sequence corresponding to the imaging sequence condition set at the imaging sequence condition setting step, thereby reconstructing images of the imaging slice areas, wherein at the image reconstruction step, the phase of the imaging data is corrected based on the phase difference calculated by the phase difference calculation step so as to eliminate the phase difference at which the phase of each magnetic resonance signal acquired when the RF pulse subsequent to having been adjusted in frequency so as to correspond to the slice tracking method is transmitted upon execution of the scan in the imaging sequence, changes, and thereafter the image reconstruction processing is executed.

According to the invention, there can be provided a magnetic resonance imaging apparatus and a magnetic resonance imaging method capable of suppressing the occurrence of ghosts and enhancing image quality.

Further objects and advantages of the present invention will be apparent from the following description of the preferred embodiments of the invention as illustrated in the accompanying drawings.

DETAILED DESCRIPTION OF THE INVENTION

One example of an embodiment according to the invention will be explained below with reference to the accompanying drawings.

Figure 1:
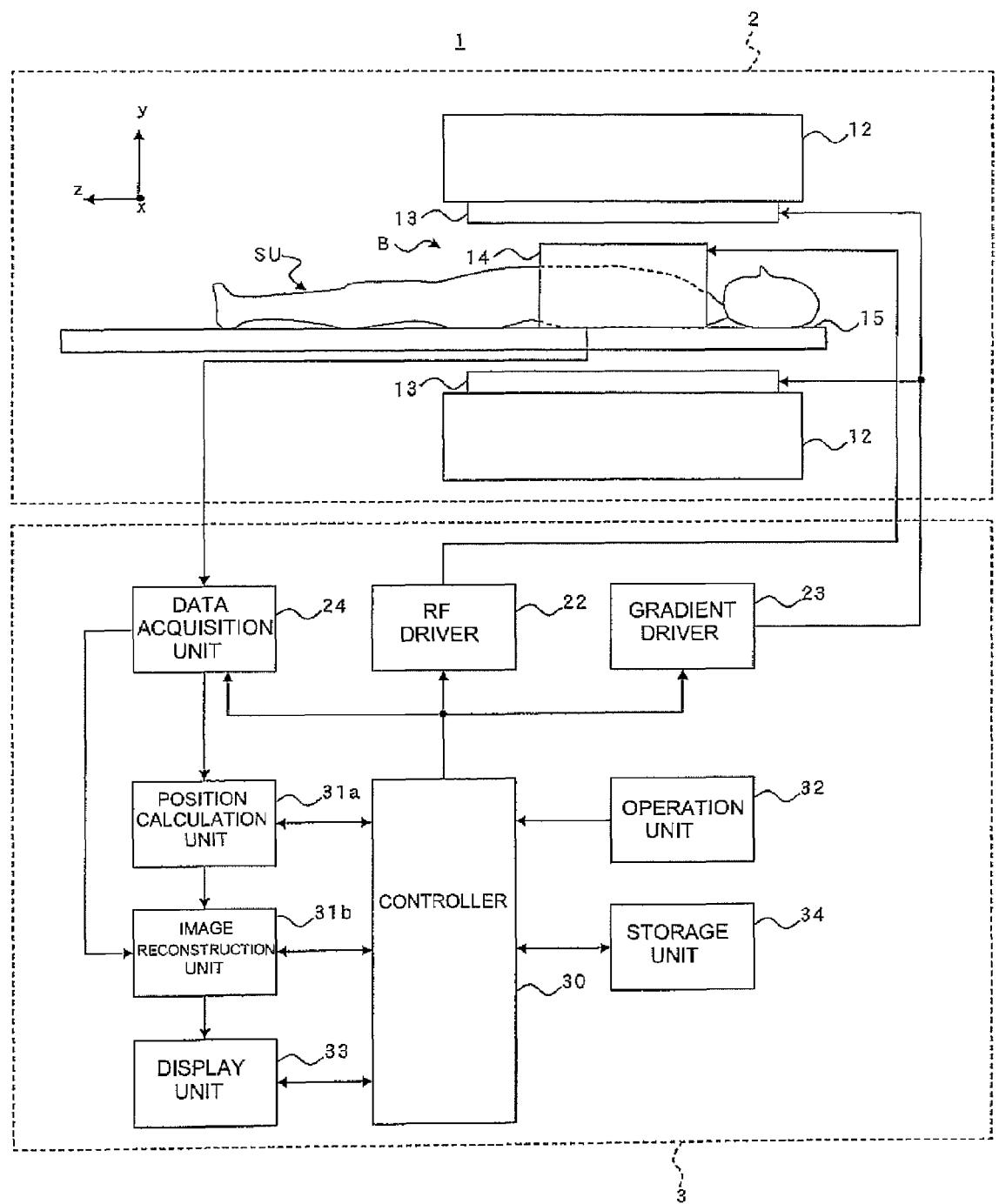
FIG. 1 is a configuration diagram showing a construction of a magnetic resonance imaging apparatus 1 illustrative of a first embodiment according to the invention.

FIG. 1 is a configuration diagram showing an outline of a construction of a magnetic resonance imaging apparatus 1 illustrative of a first embodiment according to the invention.

Apparatus construction. FIG. 1 is a configuration diagram showing the construction of the magnetic resonance imaging apparatus 1 illustrative of the first embodiment according to the invention.

As shown in FIG. 1, the magnetic resonance imaging apparatus 1 has a scan section 2 and an operation console section 3. Here, the scan section 2 has a static magnetic field magnet unit 12, a gradient coil unit 13, an RF coil unit or part 14, an RF driver 22, a gradient driver 23, a data acquisition unit 24, and a cradle 15 as shown in FIG. 1. As shown in FIG. 1, the operation console section 3 has a controller 30, a position calculation unit 31a, an image reconstruction unit 31b, an operation unit 32, a display or display unit 33 and a storage unit 34.

As shown in FIG. 1, the scan section 2 includes an imaging space B which is formed with a static magnetic field and in which an imaging slice area containing a target for imaging at a subject SU is accommodated or held. The scan section 2 executes a scan for the subject SU in accordance with an imaging sequence for applying each of RF pulses to the imaging slice area of the subject SU accommodated in the imaging space B formed with the static magnetic field, based on a control signal outputted from the operation console section 3 and thereby acquiring magnetic resonance signals produced from the imaging slice areas as imaging data.

Respective constituent elements of the scan section 2 will be described sequentially.

The static magnetic field magnet unit 12 is of, for example, a horizontal magnetic field type. A superconductive magnet (not shown) forms a static magnetic field along the direction (z direction) of a body axis of the subject SU placed in the imaging space B in which the subject SU is accommodated or held. Incidentally, the static magnetic field magnet unit 12 may be a vertical magnetic field type other than the horizontal magnetic field type, which forms a static magnetic field along the direction in which a pair of permanent magnets faces each other.

The gradient coil unit 13 forms a gradient magnetic field in the imaging space B formed with the static magnetic field and applies or adds spatial position information to each magnetic resonance signal received by the RF coil unit 14. Here, the gradient coil unit 13 includes three systems set so as to form a gradient magnetic field in association with mutually intersecting three-axis directions of a z direction extending along a static magnetic field direction, an x direction and a y direction. These transmit gradient pulses in a frequency encode direction, a phase encode direction and a slice selection direction, based on a control signal outputted from the controller 30 thereby to form gradient magnetic fields. Described specifically, the gradient coil unit 13 applies the gradient magnetic field in the slice selection direction of the subject SU and selects each slice of the subject SU excited by transmission of each RF pulse by the RF coil unit 14. The gradient coil unit 13 applies the gradient magnetic field in the phase encode direction of the subject SU and phase-encodes a magnetic resonance signal from the slice excited by the RF pulse. And the gradient coil unit 13 applies the gradient magnetic field in the frequency encode direction of the subject SU and frequency-encodes the magnetic resonance signal from the slice excited by the RF pulse.

As shown in FIG. 1, the RF coil unit 14 is disposed so as to surround the subject SU. The RF coil unit 14 transmits an RF pulse corresponding to an electromagnetic wave to the subject SU within the imaging space B formed with the static magnetic field by the static magnetic field magnet unit 12, based on a control signal outputted from the controller 30 thereby to form a high frequency magnetic field. Thus, the spins of proton in the imaging slice area of the subject SU are excited. Further, the RF coil unit 14 receives an electromagnetic wave generated when each of the excited spins of proton in the imaging slice area of the subject SU is returned to the original magnetization vector, as a magnetic resonance signal.

The cradle 15 is a table including a horizontal plane, which places the subject SU thereon. The cradle 15 is moved between the inside and outside of the imaging space B, based on a control signal supplied from the controller 30.

The RF driver 22 drives the RF coil unit 14 to transmit an RF pulse to within the imaging space B, thereby forming a high frequency magnetic field in the imaging space B. The RF driver 22 modulates a signal sent from an RF oscillator to a signal having predetermined timing and predetermined envelope using a gate modulator on the basis of the control signal outputted from the controller 30. Thereafter, the RF driver 22 allows an RF power amplifier to amplify the signal modulated by the gate modulator and outputs the same to the RF coil unit 14, and allows the RF coil unit 14 to transmit the corresponding RF pulse.

The gradient driver 23 applies a gradient pulse to the gradient coil unit 13, based on the control signal outputted from the controller 30 to drive the same, thereby generating a gradient magnetic field within the imaging space B formed with the static magnetic field. The gradient driver 23 has a three-system drive circuit (not shown) in association with the three-system gradient coil unit 13.

The data acquisition unit 24 acquires each magnetic resonance signal received by the RF coil unit 14 based on the control signal outputted from the controller 30. Here, the data acquisition unit 24 phase-detects the magnetic resonance signal received by the RF coil unit 14, using a phase detector with the output of the RF oscillator of the RF driver 22 as a reference signal. Thereafter, the data acquisition unit 24 converts the magnetic resonance signal corresponding to the analog signal into a digital signal by using an A/D converter and outputs it therefrom.

The operation console section 3 will be explained.

The operation console section 3 controls the scan section 2 such that the scan section 2 executes a scan for the subject, and generates each image about the subject, based on the magnetic resonance signal obtained by the scan executed by the scan section 2 and displays the generated image.

Respective parts that constitute the operation console section 3 will be described sequentially.

The controller 30 has a computer and a memory that stores programs that allow the computer to execute predetermined data processing, and controls respective parts. Here, the controller 30 inputs operation data sent from the operation unit 32 and controls the scan section 2 based on the operation data inputted from the operation unit 32. That is, as shown in FIG. 1, the controller 30 outputs control signals to the RF driver 22, gradient driver 23 and data acquisition unit 24 and thereby controls the operations of the respective parts so as to correspond to set scan conditions. Along with it, the controller 30 outputs control signals to the data processor 31, display unit 33 and storage unit 34 to perform control thereof.

Figure 2:
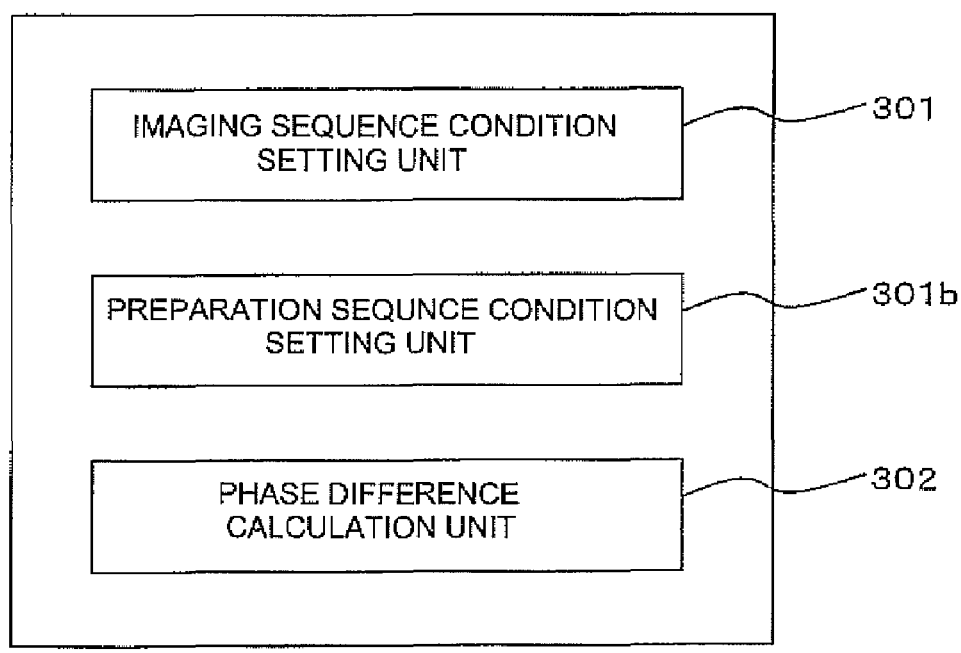
FIG. 2 is a block diagram showing a configuration of a controller 30 employed in the first embodiment according to the invention.

FIG. 2 is a block diagram showing the configuration of the controller 30 employed in the first embodiment according to the invention.

As shown in FIG. 2, the controller 30 has an imaging sequence condition setting unit 301, a preparation sequence condition setting unit 301b and a phase difference calculation unit 302. The controller 30 controls the operations of the scan section 2 and the image reconstruction unit 31b based on the position of a body-moved target for imaging. Although its details will be described later, the controller 30 controls the operation of the scan section 2 in such a manner that the scan section 2 executes a scan based on an imaging sequence on the basis of an imaging sequence condition set so as to correspond to a slice tracking method by the imaging sequence condition setting unit 301. When an RF pulse subsequent to having been adjusted in frequency so as to correspond to the slice tracking method is transmitted upon execution of the scan based on the imaging sequence along with it, the phase difference calculation unit 302 calculates a phase difference at which the phases of spins change in an imaging slice area. Thus, the controller 30 controls the operation of at least one of the scan section 2 and the image reconstruction unit 31b, based on the phase difference calculated by the phase difference calculation unit 302. That is, the controller 30 controls the operation of at least one of the scan section 2 and the image reconstruction unit 31b, based on the phase difference calculated by the phase difference calculation unit 302 to avoid the occurrence of ghosts in each slice image due to a phase difference at which the phase of each magnetic resonance signal changes with the movement of the imaging slice area. In the present embodiment, the controller 30 controls the operation of the scan section 2 in such a manner that the scan for the subject is carried out by execution of a preparation sequence by the scan section 2, based on a preparation sequence condition set by the preparation sequence condition setting unit 301b.

Respective parts of the controller 30 will be explained sequentially.

The imaging sequence condition setting unit 301 sets an imaging sequence condition at the time that the scan section 2 executes the scan in the imaging sequence, based on the operation data inputted from the operation unit 32.

In the present embodiment, the imaging sequence condition setting unit 301 sets the imaging sequence condition such that it corresponds to the slice tracking method. Described specifically, when the scan section 2 executes the scan in accordance with the imaging sequence, the imaging sequence condition setting unit 301 adjusts at least the frequency of each RF pulse transmitted in the imaging sequence, based on the position calculated by the position calculation unit 31a in such a manner that imaging data are acquired from the body-moved target for imaging, thereby changing the position of each imaging slice area.

In the present embodiment in addition to this, the imaging sequence condition setting unit 301 sets an imaging sequence condition so as to eliminate a phase difference at which the phase of each magnetic resonance signal changes in the imaging slice area, when the RF pulse adjusted in frequency so as to correspond to the slice tracking method is transmitted upon execution of the scan in the imaging sequence. Described specifically, when the imaging sequence condition is set, the imaging sequence condition setting unit 301 adjusts the phase of the RF pulse transmitted upon execution of the imaging sequence, based on the phase difference calculated by the phase difference calculation unit 302.

The preparation sequence condition setting unit 301b sets a preparation sequence condition at which the scan section 2 executes a scan based on the preparation sequence before the execution of the scan in the imaging sequence, on the basis of the operation data inputted from the operation unit 32.

In the present embodiment, the preparation sequence condition setting unit 301b transmits an RF pulse to a first slice area of the subject at a first frequency in the imaging space B formed with the static magnetic field and sets a preparation sequence condition in such a manner that a first preparation sequence for acquiring each magnetic resonance signal produced from the first slice area as first preparation data is executed as the preparation sequence. Described specifically, the preparation sequence condition setting unit 301b sets a preparation sequence condition in such a manner that a pulse sequence free of transmission of a phase encode gradient pulse is brought to a first preparation sequence at the imaging sequence set by the imaging sequence condition setting unit 301.

Further, the preparation sequence condition setting unit 301b transmits an RF pulse of a second frequency different from the first frequency in such a manner that each magnetic resonance signal is acquired from a second slice area arranged at a position different from that for the first slice area as viewed in a slice-axis direction of the first slice area at the subject, and sets a preparation sequence condition in such a manner that a second preparation sequence for acquiring each magnetic resonance signal produced from the second slice area as second preparation data is executed as a preparation sequence. Described specifically, the preparation sequence condition setting unit 301b sets a preparation sequence condition in such a manner that magnetic resonance signals are respectively acquired from a plurality of the second slice areas different in position as viewed in the slice-axis direction of the first slice area at the subject as second preparation data in a second preparation sequence.

That is, the preparation sequence condition is set in such a manner that the execution of a scan in the preparation sequence including the first preparation sequence and the second preparation sequence different from the first preparation sequence is done before the execution of the scan based on the imaging sequence.

Here, the preparation sequence condition setting unit 301b sets the preparation sequence condition in such a manner that a navigation sequence for acquiring magnetic resonance signals produced in an area containing the diaphragm at the subject as navigator echo data is contained in a preparation sequence.

When the RF pulse subsequent to having been adjusted in frequency by the imaging sequence condition setting unit 301 is transmitted upon the execution of the scan in the imaging sequence, the phase difference calculation unit 302 calculates a phase difference at which the phase of each magnetic resonance signal produced in the imaging slice area changes. That is, when the RF pulse subsequent to the adjustment in its frequency is transmitted upon the execution of the scan in the imaging sequence so as to correspond to an imaging slice area in which a target for imaging is displaced from a reference position due to body motion, the phase difference calculation unit 302 calculates a phase difference at which the phase of a magnetic resonance signal produced in the imaging slice area shifted from the reference position changes from the phase of a magnetic resonance signal produced at the reference position.

In the present embodiment, the phase difference calculation unit 302 calculates the phase difference, based on the first preparation data and the second preparation data respectively acquired by allowing the scan section 2 to execute the scans based on the preparation sequence set so as to contain the first and second preparation sequences by the preparation sequence condition setting unit 301b. Although the details thereof will be described later, the phase difference calculation unit 302 executes a one-dimensional Fourier transform process on the first preparation data and the second preparation data thereby to calculate projection images of first and second slice areas and calculates a function indicative of a relationship between a distance (amount of travel or movement) at which an imaging slice area is moved, and a phase difference produced by the movement of the imaging slice area, based on the respective phases of the calculated projection images. Thereafter, the phase difference calculation unit 302 calculates a phase difference developed where the RF pulse after having been adjusted in frequency by the imaging sequence condition setting unit 301 is transmitted, using the function indicative of the relationship between the distance at which the imaging slice area is moved, and the phase difference produced due to the movement of the imaging slice area.

The position calculation unit 31a in the operation console section 3 has a computer and programs for allowing the computer to execute predetermined data processing. The position calculation unit 31a executes data processing so as to detect the position at which the corresponding imaging target is body-moved due to the body movement of the subject SU.

In the present embodiment, the position detection unit 31a detects a cardiac time phase based on heartbeat motion of the subject SU using a cardiograph. In the present embodiment in addition to this, the position calculation unit 31a calculates the position of an imaging target body-moved by a breathing exercise of the subject. Described specifically, the position calculation unit 31a calculates the position of the imaging target moved by the breathing exercise thereof, based on the navigator echo data acquired by allowing the scan section 2 to execute the scan corresponding to the navigation sequence with respect to the diaphragm moved by the breathing exercise of the subject.

The image reconstruction unit 31b has a computer and a memory that stores therein programs for allowing the computer to execute predetermined data processing. The image reconstruction unit 31b executes image reconstruction processing, based on the control signal supplied from the controller 30 to reconstruct each image. Here, imaging data acquired so as to correspond to a k space by executing the scan for the imaging slice area by the scan section 2 using the imaging sequence are subjected to a Fourier transform process, thereby executing the image reconstructing process, whereby each image of the imaging slice area is reconstructed. And the image reconstruction unit 31b outputs data about each reconstructed image to the display unit 33.

The operation unit 32 is constituted of an operation device such as a keyboard, a pointing device or the like. The operation unit 32 inputs operation data from an operator and outputs the same to the controller 30.

The display unit 33 is constituted of a display device such as a CRT and displays each image on its display screen, based on the control signal outputted from the controller 30. For example, the display unit 33 displays images about input items corresponding to the operation data inputted to the operation unit 32 by the operator on the display screen in plural form. Further, the display unit 33 receives data about each image about the imaging slice area reconstructed by the image reconstruction unit 31b and displays the image on the display screen.

The storage unit 34 includes a storage device such as a memory and stores various data therein. In the storage unit 34, the stored data are accessed by the controller 30 as needed.

Operation. The operation of imaging the subject SU will be explained below using the magnetic resonance imaging apparatus 1 illustrative of the present embodiment referred to above.

Figure 3:
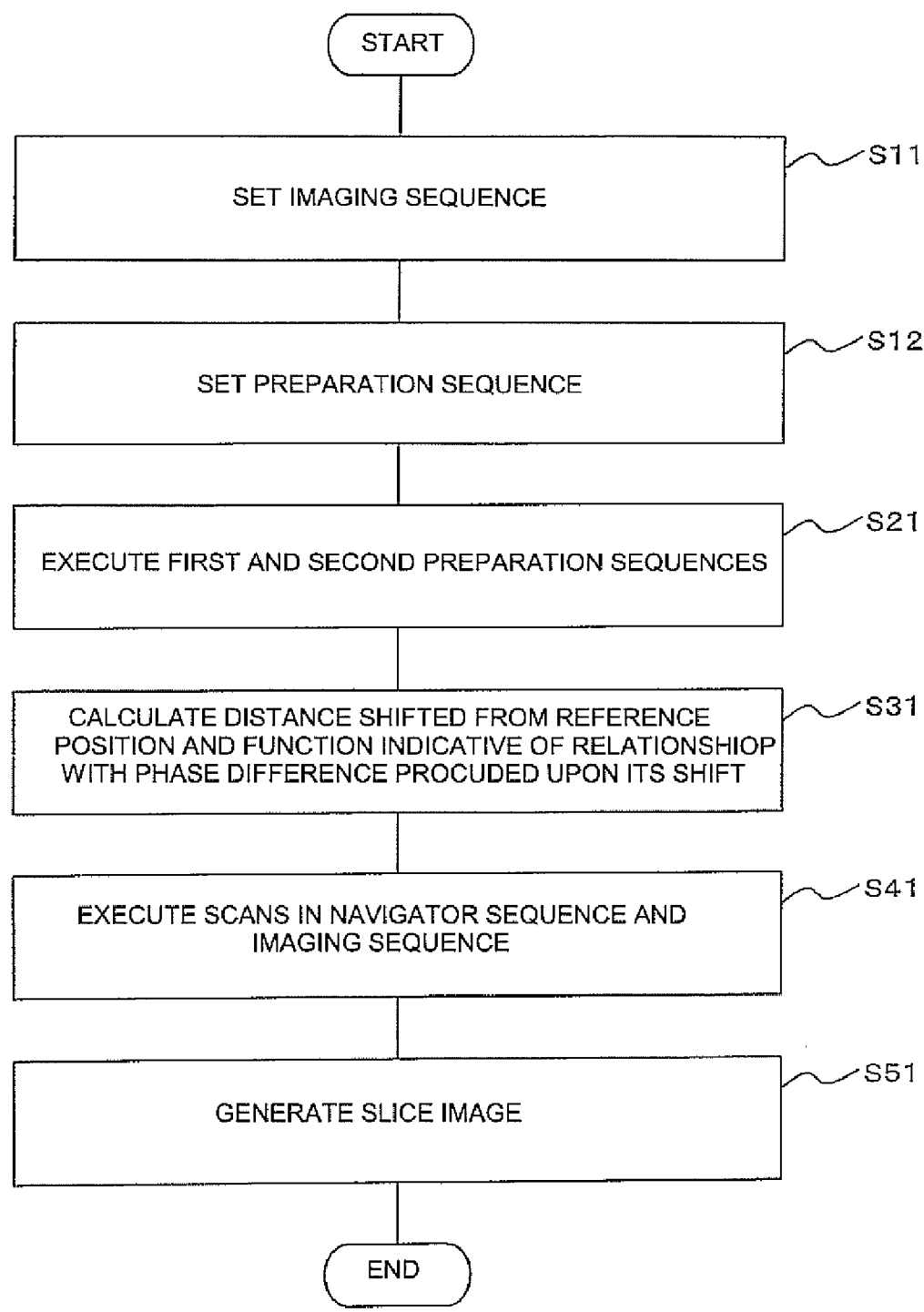
FIG. 3 is a flowchart showing operation of the first embodiment according to the invention at the time that a subject SU is imaged or photographed.

FIG. 3 is a flowchart showing operation of the first embodiment according to the invention at the time that the subject SU is imaged or photographed.

As shown in FIG. 3, the setting of an imaging sequence is first executed (S11).

Here, the imaging sequence condition setting unit 301 sets an imaging sequence condition under which the scan section 2 executes a scan in the imaging sequence, based on the operation data inputted from the operation unit 32.

Figure 4:
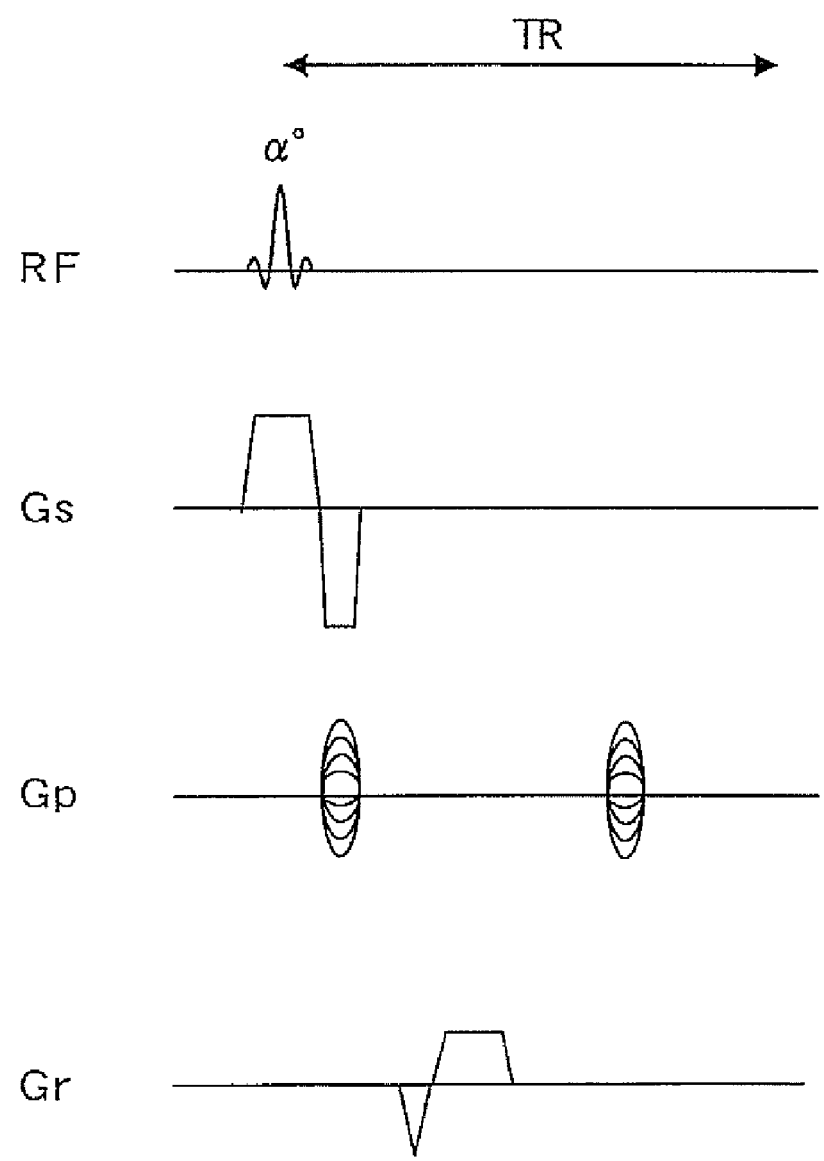
FIG. 4 is a pulse sequence diagram showing a pulse sequence set as an imaging sequence condition by an imaging sequence condition setting unit 301 in the first embodiment according to the invention.

FIG. 4 is a pulse sequence diagram showing a pulse sequence set as an imaging sequence condition by the imaging sequence condition setting unit 301 in the first embodiment according to the invention. In FIG. 4, an RF pulse RF, a gradient pulse Gs in a slice selection direction, a gradient pulse Gp in a phase encode direction, and a gradient pulse Gr in a frequency encode direction are shown. Incidentally, in the present embodiment, the vertical axis indicates strength, and the horizontal axis indicates time.

In the present embodiment as shown in FIG. 4, for example, an imaging sequence condition is set at a pulse sequence corresponding to the GRE (Gradient Recalled Echo) method, for example, in such a manner that an imaging sequence about an imaging slice area corresponding to a chest region of a subject is repeatedly executed every time of repetition TR.

Here, the imaging sequence condition is set so as to correspond to the slice tracking method.

Next, as shown in FIG. 3, the setting of a preparation sequence is executed (S12).

Here, before the execution of the scan in the imaging sequence, the preparation sequence condition setting unit 301b sets a preparation sequence condition at the time that the scan section 2 executes a scan in the preparation sequence, based on the operation data inputted from the operation unit 32.

In the present embodiment, a first preparation sequence is set in such a manner that an RF pulse is transmitted at a first frequency to a first slice area of the subject within an imaging space B formed with a static magnetic field, and each magnetic resonance signal produced from the first slice area is acquired as first preparation data.

Figure 5:
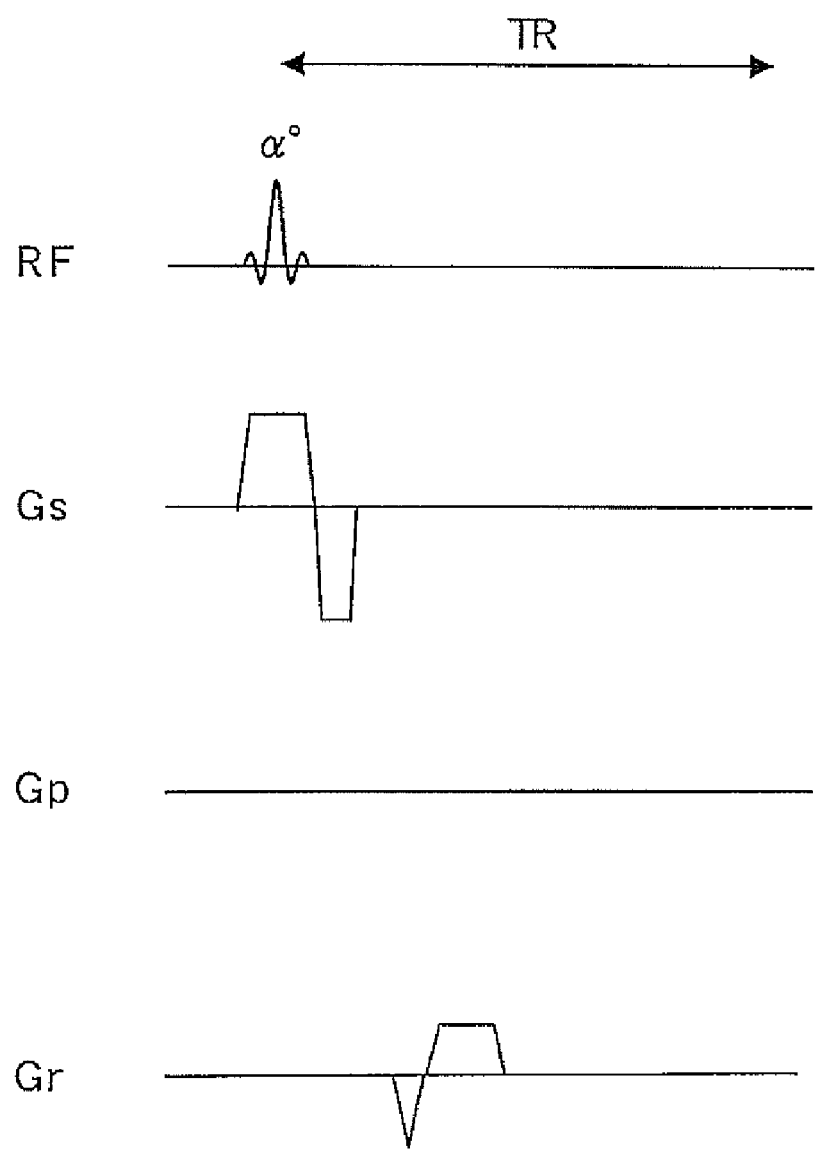
FIG. 5 is a pulse sequence diagram showing a pulse sequence set as a preparation sequence condition by a preparation sequence condition setting unit 301b in the first embodiment according to the invention.

FIG. 5 is a pulse sequence diagram showing a pulse sequence set as a preparation sequence condition by the preparation sequence condition setting unit 301b in the first embodiment according to the invention. In FIG. 5, an RF pulse RF, a gradient pulse Gs in a slice selection direction, a gradient pulse Gp in a phase encode direction, and a gradient pulse Gr in a frequency encode direction are shown. Incidentally, in the present embodiment, the vertical axis indicates strength, and the horizontal axis indicates time.

As shown in FIG. 5, a preparation sequence condition is set in such a manner that a first preparation sequence is repeatedly executed every time of repetition TR at the pulse sequence corresponding to the GRE method in a manner similar to the imaging sequence. In the present embodiment as shown in FIG. 5, a preparation sequence condition is set in such a manner that a pulse sequence free of transmission of the gradient pulse Gp in the phase encode direction is brought to the first preparation sequence at the imaging sequence set by the imaging sequence condition setting unit 301.

Further, a preparation sequence condition for a second preparation sequence is set in such a manner that each magnetic resonance signal is acquired from a second slice area arranged at a position different from the first slice area in which the scan is executed in the first preparation sequence, as viewed in a slice-axis direction of the first slice area at the subject. That is, the second preparation sequence is set so as to become a pulse sequence similar to the first preparation sequence except that the RF pulse is transmitted at the second frequency different from the first frequency transmitted in the first preparation sequence and each magnetic resonance signal produced from the second slice area is acquired as second preparation data. Here, a preparation sequence condition is set in such a manner that magnetic resonance signals are respectively acquired from a plurality of second slice areas different in position as viewed in the slice-axis direction of the first slice area at the subject as second preparation data in the second preparation sequence.

Figure 6:
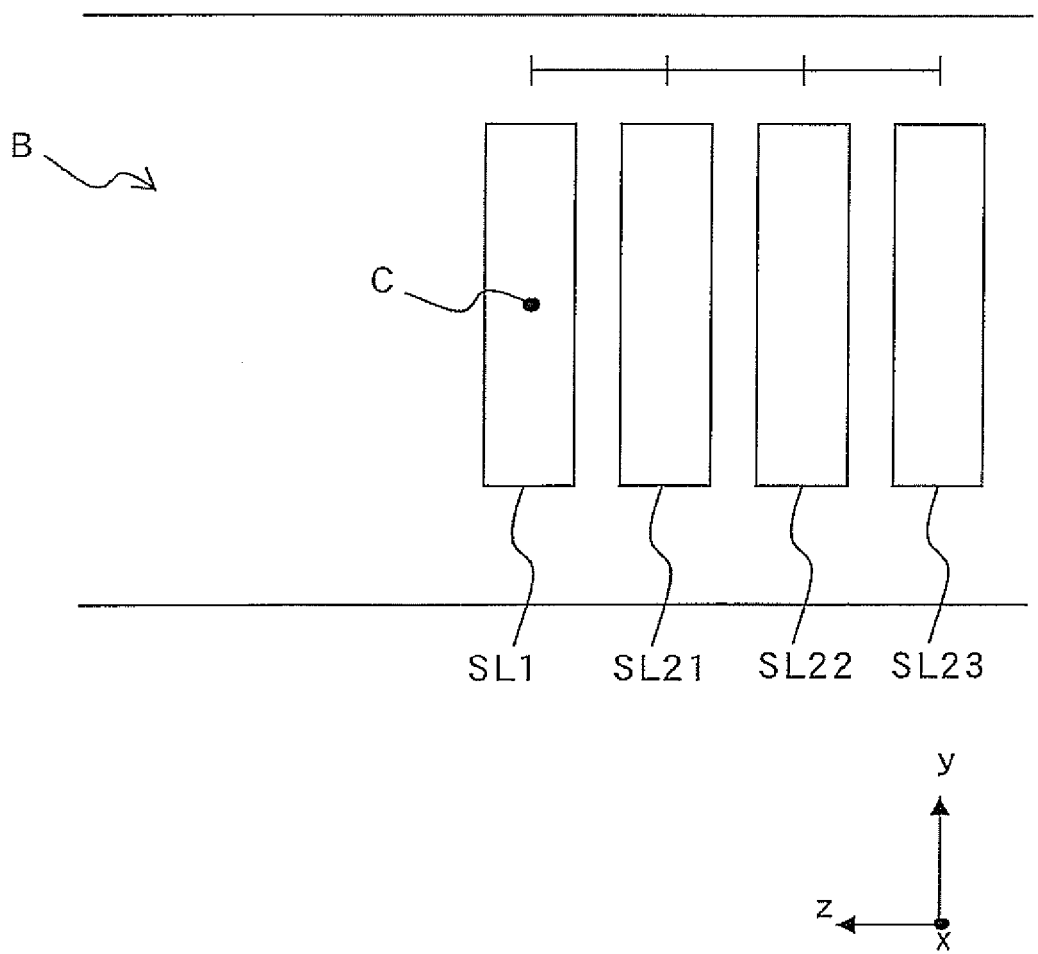
FIG. 6 is a diagram showing slice positions where scans are executed in a first preparation sequence and a second preparation sequence upon setting of a preparation sequence as a preparation sequence condition by the preparation sequence condition setting unit 301b in the first embodiment according to the invention.

FIG. 6 is a diagram showing slice positions where scans are executed in the first and second preparation sequences upon setting of a preparation sequence as a preparation sequence condition by the preparation sequence condition setting unit 301b in the first embodiment according to the invention.

The corresponding preparation sequence condition is set in such a manner that in the first preparation sequence as shown in FIG. 6, for example, a slice corresponding to a center C of an imaging space B formed with a static magnetic field is defined as a first slice area SL1, and each magnetic resonance signal is acquired from the first slice area SL1.

On the other hand, the corresponding preparation sequence condition is set in such a manner that in the second preparation sequence as shown in FIG. 6, a plurality of slices which are located at positions different from the position of the first slice area SL1 in which the scan is executed in the first preparation sequence and which are positioned so as to differ from the first slice area SL1 as viewed in a z direction corresponding to a slice-axis direction, are defined as second slice areas SL21, SL22 and SL23, and magnetic resonance signals are acquired from the second slice areas SL21, SL22 and SL23. For example, slice positions sequentially shifted 1 mm by 1 mm in the z direction corresponding to the slice-axis direction from the first slice area SL1 are respectively defined as the second slice areas SL21, SL22 and SL23. The corresponding preparation sequence condition is set in such a manner that second preparation data are acquired from the second slice areas SL21, SL22 and SL23.

Here, the preparation sequence condition is set in such a manner that a navigation sequence for acquiring each magnetic resonance signal produced in an area including the diaphragm at the subject as navigator echo data is contained in a preparation sequence.

Next, as shown in FIG. 3, the execution of the first and second preparation sequences is done (S21).

Here, the scan section 2 executes the scans for the first and second preparation sequences so as to correspond to the preparation sequence conditions set for the first and second preparation sequences in the above-described manner.

That is, as shown in FIG. 6, the preparation sequences are executed on the first slice area SL1 and the second slice areas SL21, SL22 and SL23 arranged in the z direction corresponding to the slice-axis direction. The magnetic resonance signals produced in the first slice area SL1 and the second slice areas SL21, SL22 and SL23 are respectively acquired as the first and second preparation data.

Next, as shown in FIG. 3, the calculation of a function indicative of a relationship between a distance shifted from a reference position and a phase difference produced upon its shift is done (S31).

Here, the phase difference calculation unit 302 executes a one-dimensional Fourier transform process on the first and second preparation data. Consequently, projection images of the first slice area SL1 and second slice areas SL21, SL22 and SL23 are calculated. Thereafter, the phase difference calculation unit 302 calculates the function indicative of the relationship between the distance shifted from the reference position and the phase difference produced when it is shifted from the reference position.

Figure 7:
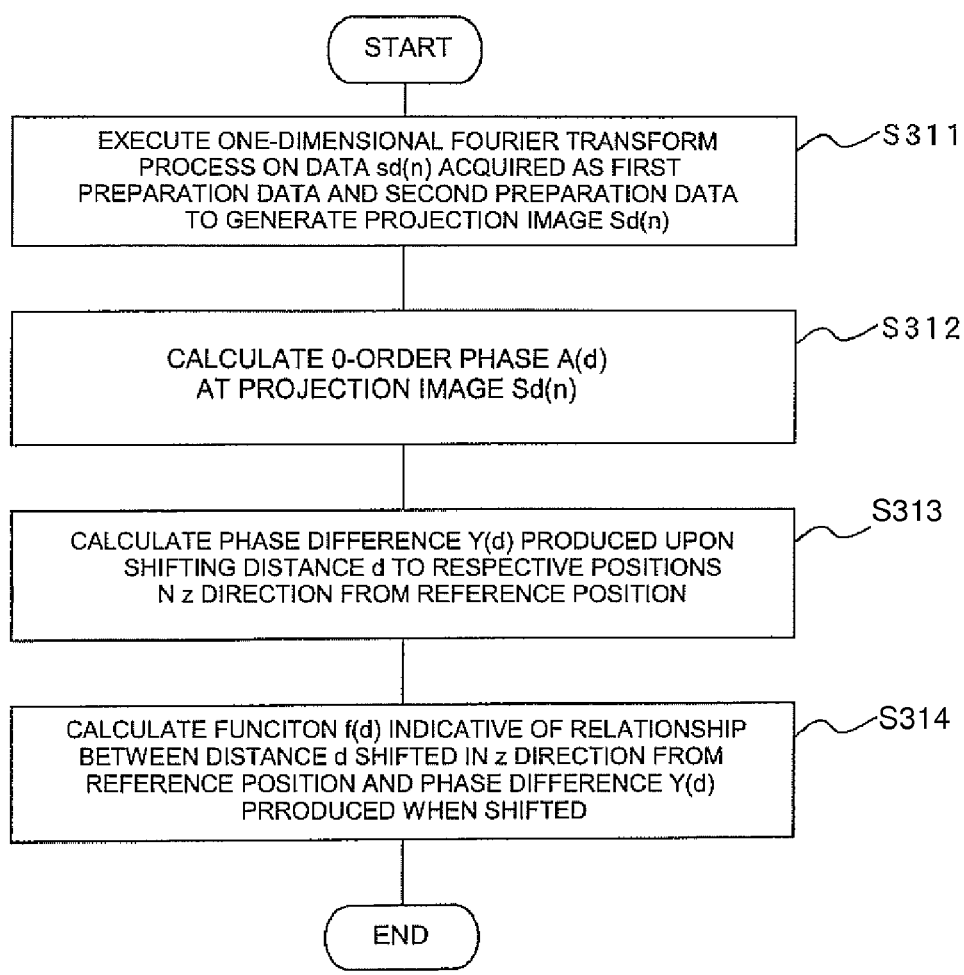
FIG. 7 is a flowchart showing the operation of calculating the function indicative of the relationship between the distance shifted from the reference position and the phase difference produced upon its shift in the first embodiment according to the invention.
Figure 8:
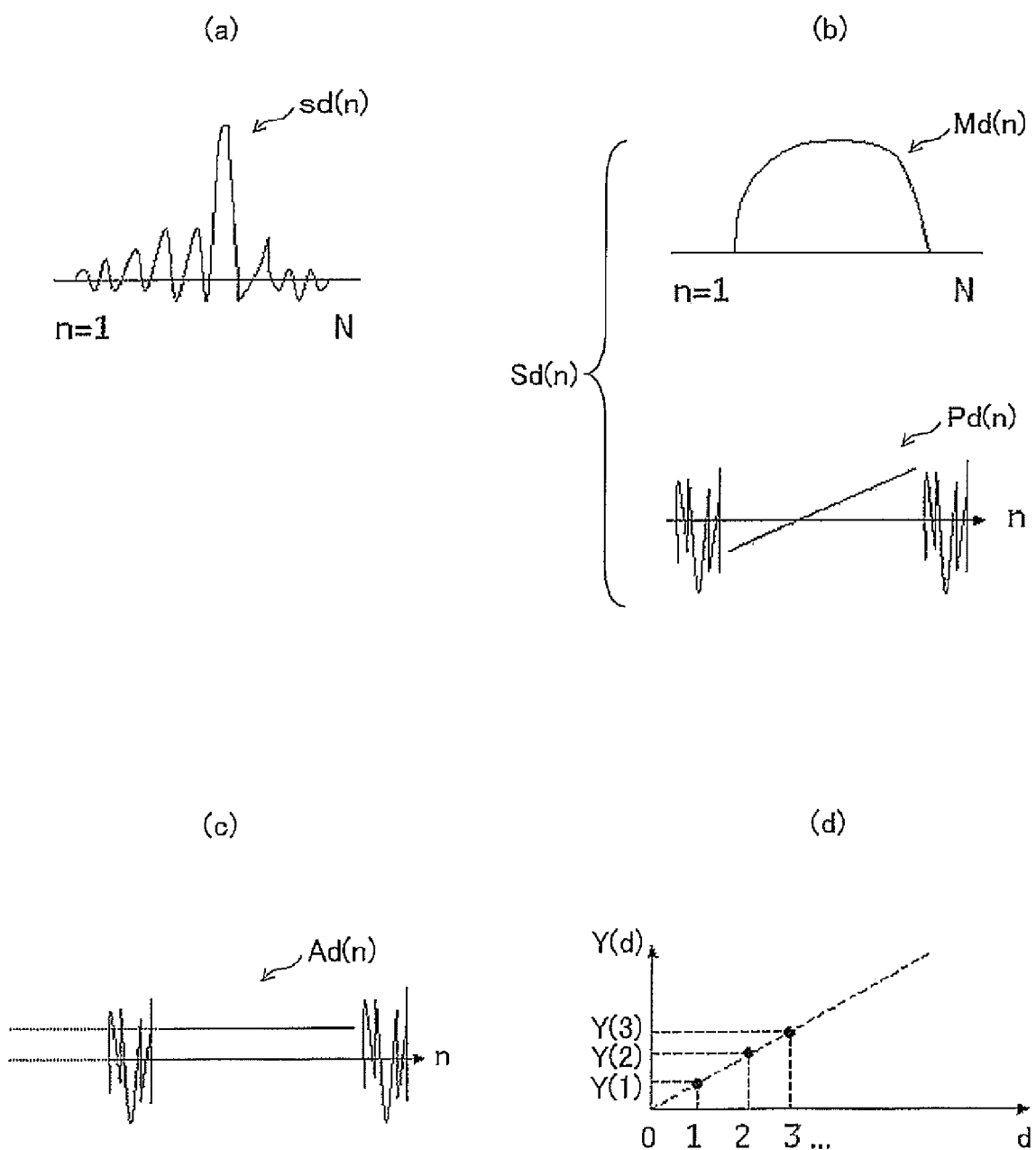
FIG. 8 is a diagram for conceptually the operation of calculating the function indicative of the relationship between the distance shifted from the reference position and the phase difference produced upon its shift in the first embodiment according to the invention.

FIG. 7 is a flowchart showing the operation of calculating the function indicative of the relationship between the distance shifted from the reference position and the phase difference produced upon its shift in the first embodiment according to the invention. FIG. 8 is a diagram for conceptually the operation of calculating the function indicative of the relationship between the distance shifted from the reference position and the phase difference produced upon its shift in the first embodiment according to the invention. In FIG. 8, (a), (b), (c) and (d) show that the operation proceeds sequentially.

As shown in FIG. 7, a one-dimensional Fourier transform process is first executed on data sd(n) acquired as first preparation data and second preparation data to generate projection images Sd(n) (S311).

Here, as shown in FIG. 8(a), the phase difference calculation unit 302 acquires or obtains the data sd(n) acquired as the first preparation data and the second preparation data. Then, the one-dimensional Fourier transform process is performed on the data sd(n) thereby to generate projection images Sd(n) as shown in FIG. 8(b).

Described specifically, a one-dimensional Fourier transform process is executed on first preparation data $s0(n)$ acquired from the reference position (d=0) to generate a projection image $S0(n)$. Further, the above process is performed on second preparation data $s1(n)$, $s2(n)$ and $s3(n)$ acquired at respective positions shifted by a distance d (d=1 mm, 2 mm and 3 mm) from the reference position as viewed in the z direction, thereby to generate projection images $S1(n)$, $S2(n)$ and $S3(n)$.

Thus, the projection images $S0(n)$, $S1(n)$, $S2(n)$ and $S3(n)$ at the respective positions corresponding to the reference position (d=0), the position (d=1) shifted by 1 mm from the reference position (d=0) as viewed in the z direction, the position (d=2) shifted by 2 mm in like manner, and the position (d=3) shifted by 3 mm in like manner are respectively calculated.

Since the respective projection images Sd(n) are respectively expressed in magnitude Md(n) and phase Pd(n) as expressed by the following equation (1), the projection images are represented as shown in FIG. 8(b) (j: constant).

$$Sd(n)=Md(n)\cdot\exp\{j\cdot Pd(n)\} \quad (1)$$

Next, as shown in FIG. 7, a 0-order phase A(d) at the corresponding projection image Sd(n) is calculated (S312).

Here, for example, the phase Pd(n) is represented as a function of n by the 0-order phase A(d) and a first-order phase B(d) as expressed in the following equation (2).

$$Pd(n)=A(d)+B(d)\cdot n \quad (2)$$

Therefore, data about the phases Pd(n) at the projection images Sd(n) are extracted and the 0-order phases A(d) are calculated from the phases Pd(n), respectively. The 0-order phase A(d) are obtained as shown in FIG. 8(c) by using, for example, a least square method.

Thus, 0-order phases A(0), A(1), A(2) and A(3) at respective positions corresponding to a reference position (d=0), a position (d=1) shifted by 1 mm from the reference position (d=0) in the z direction, a position (d=2) shifted by 2 mm in like manner, and a position (d=3) shifted by 3 mm in like manner are respectively calculated.

Next, as shown in FIG. 7, phase differences Y(d) developed when the distance is shifted from the reference position to the respective positions at a distance d in the z direction are calculated (S313).

Here, the phase differences Y(d) developed when the distance is shifted from the reference position to the respective positions at the distance d in the z direction are calculated using the 0-order phases A(d) calculated above.

Described specifically, the process of subtracting the 0-order phase A(0) at the reference position from the 0-order phases A(1), A(2) and A(3) at the positions (d=1, 2 and 3) where the distance d is shifted in the z direction from the reference position (d=0) is executed as expressed by the following equations (3), (4) and (5), thereby calculating phase differences Y(1), Y(2) and Y(3) produced when shifted to the respective positions (d=1, 2 and 3).

$$Y(1)=A(1)-A(0) \quad (3)$$

$$Y(2)=A(2)-A(0) \quad (4)$$

$$Y(3)=A(3)-A(0) \quad (5)$$

Next, as shown in FIG. 7, a function f(d) indicative of the relationship between the distance d shifted from the reference position in the z direction and the phase difference Y(d) produced upon its shift is calculated (S314).

Here, as shown in FIG. 8 by way of example, a distance d shifted in the z direction from a reference position (d=0) and a phase difference Y(d) produced upon its shift are expressed in a first-degree or simple equation. Therefore, a function f(d) expressed by the following equation (6) is derived by executing fitting processing on the first-degree equation (α: constant).

$$Y(d)=\alpha\cdot d=f(d) \quad (6)$$

The function f(d) indicative of the relationship between the distance d shifted from the reference position (d=0) and the phase difference Y(d) produced upon its shift is calculated in this way.

Next, as shown in FIG. 3, the scans based on the corresponding navigator sequence and imaging sequence are executed (S41).

Here, the scan section 2 executes the scans in association with the preparation sequence condition and the imaging sequence condition set to the navigator sequence and the imaging sequence in the above-described manner.

Figure 9:
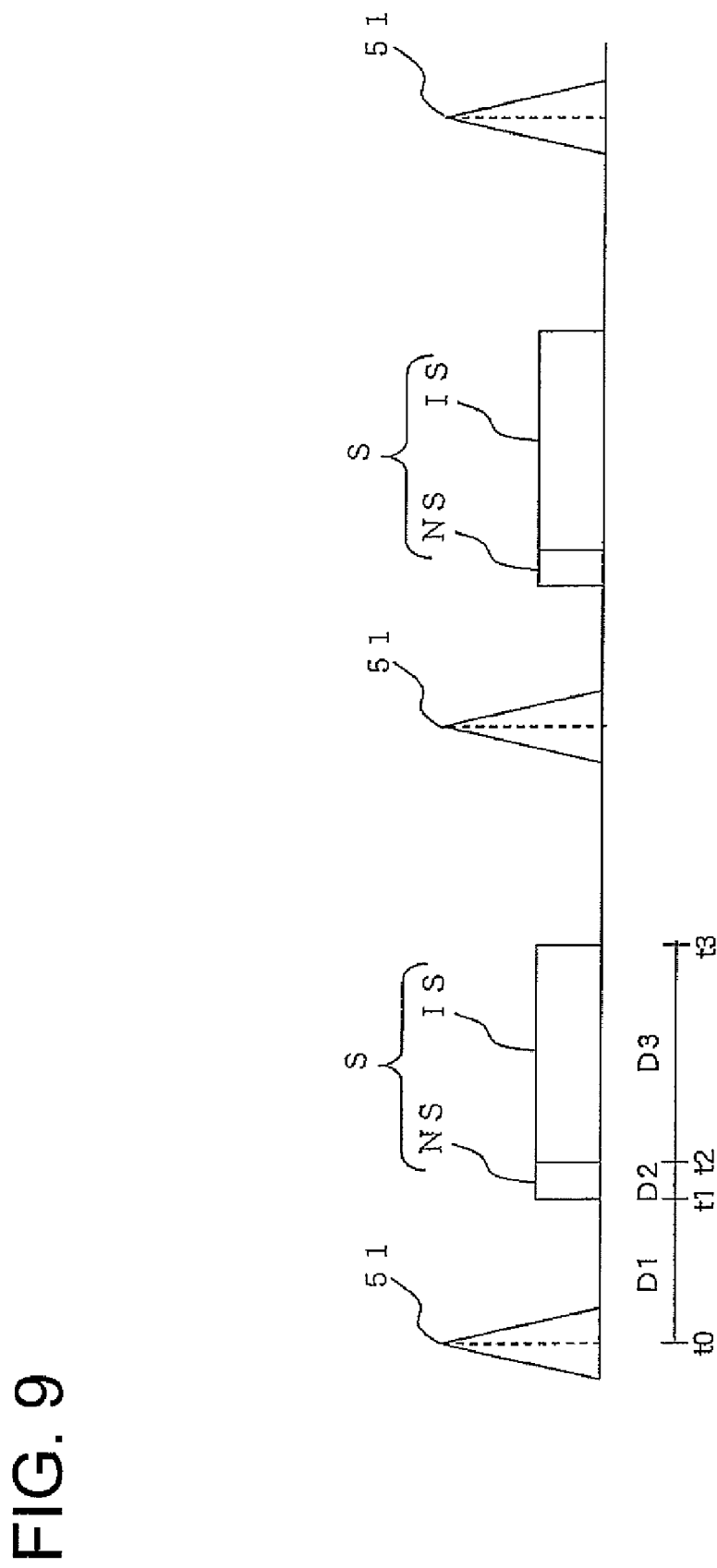
FIG. 9 is a diagram for conceptually describing the manner of execution of scans in a navigator sequence and an imaging sequence in the first embodiment according to the invention, wherein the horizontal axis indicates a time base t.

FIG. 9 is a diagram for conceptually describing the manner of execution of scans in the navigator sequence and the imaging sequence in the first embodiment according to the invention. The horizontal axis indicates a time base t.

In the present embodiment, when heartbeat motion of the subject SU is of a specific time phase, the scan section 2 repeatedly executes a scan S about the subject SU, based on an electrocardiographic signal detected by the position calculation unit 31a.

Described specifically, as shown in FIG. 9, an R wave 51 is specified at the electrocardiographic signal. At a time t1 corresponding to a systolic time or period after a predetermined delay time D1 has elapsed from a time t0 where the R wave 51 occurs, the scan section 2 starts a scan S about the chest region of the subject SU periodically and repeatedly.

Figure 10:
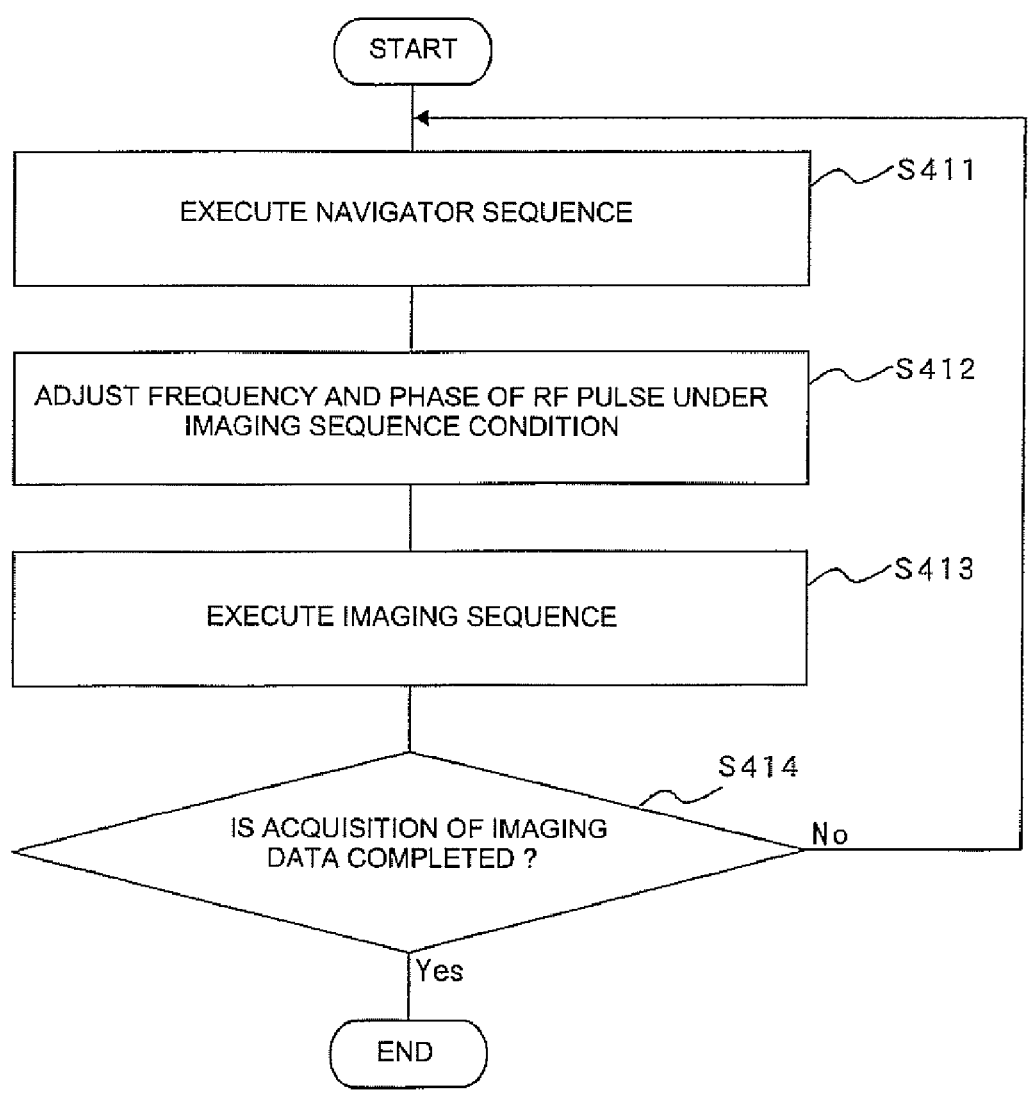
FIG. 10 is a flowchart showing the operation of executing the scans in the navigator sequence and the imaging sequence in the first embodiment according to the invention.

FIG. 10 is a flowchart showing the operation of executing the scans in the navigator sequence and the imaging sequence in the first embodiment according to the invention.

Upon execution of the scans S, the navigator sequence NS is first carried out as shown in FIG. 10 (S411).

Here, the navigator sequence NS is executed so as to correspond to a so-called navigator echo method. Described specifically, the scan section 2 selectively excites spins of an area including a diaphragm to monitor the breathing exercise of the subject SU and executes the navigator sequence NS for obtaining or acquiring magnetic resonance signals as navigator echo data. The scan section 2 executes it, based on, for example, a spin echo method. As shown in FIG. 9, the present navigator sequence NS is carried out between the time t1 at which the predetermined delay time D1 has elapsed from the time t0 at which the R wave 51 is detected, and a time t2 at which a predetermined time D2 has elapsed.

Figure 11:
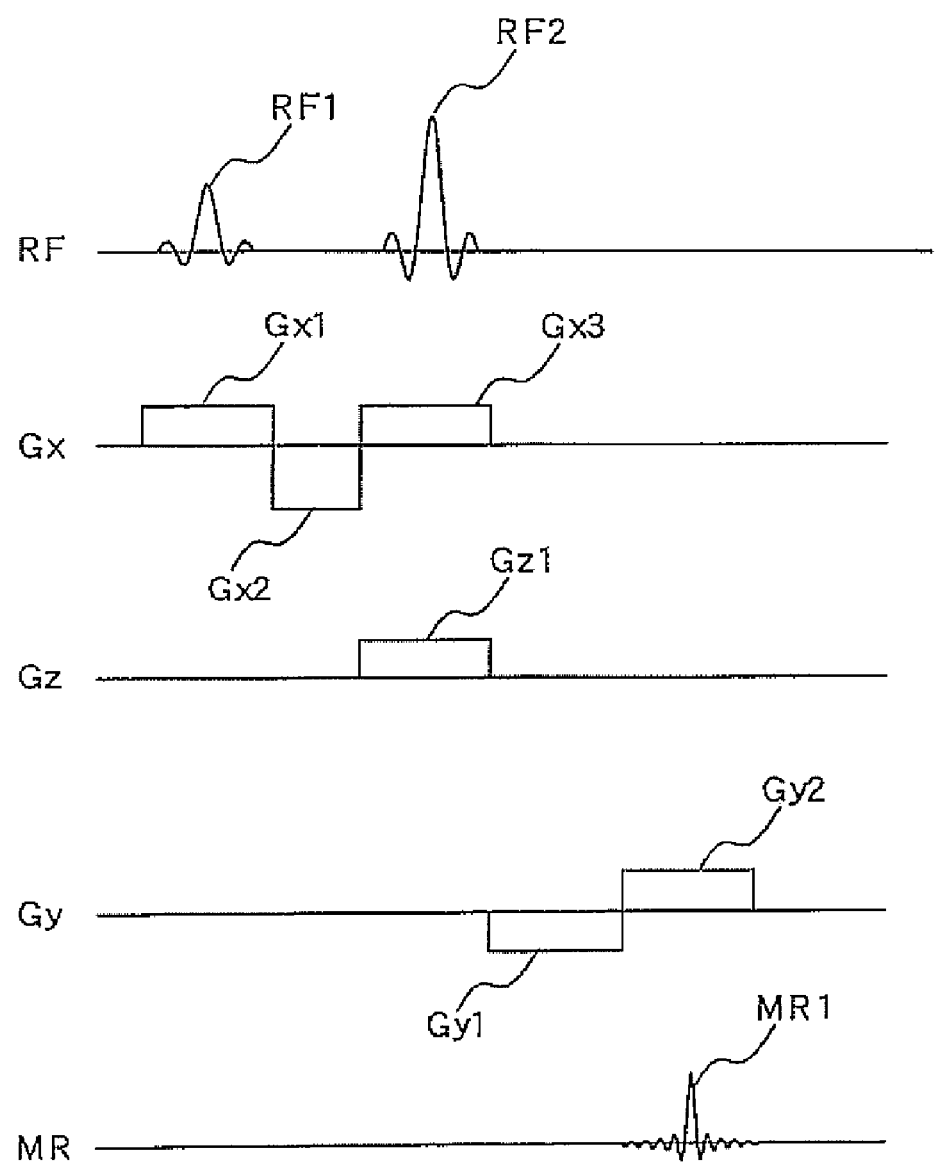
FIG. 11 is a pulse sequence diagram showing the navigator sequence NS in the first embodiment according to the invention.

FIG. 11 is a pulse sequence diagram showing the navigator sequence NS in the first embodiment according to the invention. An RF pulse RF, a gradient pulse Gx in an x direction, a gradient pulse Gz in a z direction, and a gradient pulse Gy in a y direction are shown in FIG. 11. Incidentally, the vertical axis indicates strength, and the horizontal axis indicates a time base in the present embodiment.

Upon execution of the navigator sequence NS, a first x-direction gradient pulse Gx1 is first transmitted together with a 90° pulse RF1 as shown in FIG. 11, thereby selectively exciting a fist slice plane including a diaphragm at a subject by 90°. Thereafter, a second x-direction gradient pulse Gx2 is transmitted to bring back the phase. Afterwards, a third x-direction gradient pulse Gx3 and a first z-direction gradient pulse Gz1 are transmitted together with a 180° pulse RF2 to thereby excite a second slice plane intersecting with the first slice plane by 180° in the area including the diaphragm. Then, first and second y-direction gradient magnetic fields Gy1 and Gy2 are transmitted so as to execute frequency encode, thereby acquiring or obtaining each magnetic resonance signal MR1 from an area at which the first slice plane and the second slice plane intersect, as navigator echo data.

The data acquisition unit 24 acquires each magnetic resonance signal MR1 obtained as the navigator echo data by execution of the navigator sequence NS and outputs the same to the position detection unit 31a.

Thereafter, the position detection unit 31a determines or detects the position of the diaphragm moved by the breathing exercise before the execution of the imaging sequence IS. Here, a one-dimensional inverse Fourier transform process is effected on the navigator echo data acquired in the above-described manner to generate a data profile in the area including the diaphragm. The position detection unit 31a calculates the position of the moved diaphragm from the data profile. In the present embodiment, a portion corresponding to a high signal strength in the generated profile corresponds to an abdominal region, a portion corresponding to a low signal strength in the profile corresponds to a chest region, and the boundary of the portions indicative of the abdominal and chest regions in the profile corresponds to the diaphragm. Therefore, the position detection unit 31a specifies a position at which the boundary corresponding to the diaphragm has changed from a reference position, as a position at which the diaphragm is moved, and determines a distance to the position where it has changed from the reference position.

Next, as shown in FIG. 10, the frequency and phase of the RF pulse are adjusted under the imaging sequence condition (S412).

Here, the imaging sequence condition setting unit 301 adjusts and sets the imaging sequence condition. Incidentally, the movement of each slice area, which is done by a slice tracking method to be described later, is assumed to be a slice-axis direction in the interests of simplicity. When each slice is moved even in a frequency-axis direction and a phase-axis direction, the receive frequency and phase are adjusted correspondingly.

The frequency of the RF pulse transmitted in the imaging sequence is adjusted based on the slice tracking method. That is, the position of each imaging slice area including an imaging target moved from the reference position with the movement of the diaphragm is calculated based on the result of determination of the moved position of the diaphragm by the position detection unit 31a. Thereafter, the frequency of the RF pulse transmitted in the imaging sequence is adjusted so as to correspond to the calculated position of imaging slice area.

Further, the phase of the RF pulse subsequent to having been adjusted in frequency is adjusted so as to correspond to the slice tracking method. Here, when the RF pulse is transmitted upon execution of each scan in the imaging sequence, it is adjusted and set in such a manner that a phase difference at which the phase of each magnetic resonance signal produced in the imaging slice area changes is eliminated. That is, the phase of the corresponding magnetic resonance signal produced in the imaging slice area moved from the reference position when the RF pulse subsequent to having been adjusted in frequency from a reference frequency so as to correspond to the imaging slice area in which the imaging target is displaced from the reference position due to body motion, is transmitted upon execution of each scan in the imaging sequence, and the phase of the corresponding magnetic resonance signal produced in the imaging slice area lying in the reference position when the RF pulse is transmitted at the reference frequency upon execution of each scan in the imaging sequence, are adjusted such that they are identical to each other and the no phase difference exists between both phases.

In the present embodiment, the phase of the RF pulse transmitted upon execution of the imaging sequence is adjusted based on the phase difference calculated by the phase difference calculation unit 302.

Here, when the RF pulse subsequent to having been adjusted in frequency is transmitted upon execution of each scan in the imaging sequence, the phase difference calculation unit 302 first calculates a phase difference at which the phase of each magnetic resonance signal changes in the imaging slice area.

Described specifically, a distance D at which the position of the imaging slice area including the imaging target displaced with the motion of the diaphragm is moved in the z direction corresponding to the slice-axis direction from the reference position, is determined based on the result of determination of the moved position of diaphragm by the position detection unit 31a. Thereafter, the calculated distance D is substituted into the function f(d) indicative of the relationship between the distance d shifted from the reference position to the phase difference Y(d) produced upon its shift thereby to calculate a phase difference Y(D).

When the position of the imaging slice area is shifted by 1 mm (d=1) from the reference position (d=0) as shown in FIG. 8(d) by way of example, a phase difference Y(1) corresponding to the distance d of 1 mm is calculated using the function f(d).

Thereafter, the phase of the RF pulse subsequent to having been adjusted in frequency is adjusted by shifting so as to correspond to the calculated phase difference Y(D), and the imaging sequence condition for the imaging sequence IS executed after execution of the navigator sequence IS is set.

Described specifically, the calculated phase difference Y(D) is added to the phase set upon imaging the reference position, and the RF driver 22 is set together with the adjusted frequency.

Next, as shown in FIG. 10, the imaging sequence IS is executed (S413).

Here, the scan section 2 executes the imaging sequence IS for acquiring a magnetic resonance signal used as imaging data from each slice position where a slice image about the chest region of the subject SU is generated, following the navigator sequence NS. Described specifically, the scan section 2 executes the imaging sequence IS in association with the imaging sequence condition set above. As shown in FIG. 9, the imaging sequence IS is carried out between the time t2 at which the execution of the navigator sequence NS is ended and a time t3 at which a predetermined time D3 has elapsed.

Then, the data acquisition unit 24 acquires the magnetic resonance signals obtained as the imaging data by the execution of the imaging sequence IS.

Next, as shown in FIG. 10, it is determined whether the acquisition of the imaging data is completed (S414).

Here, the controller 30 determines whether the imaging data necessary for slice images to be generated have been acquired. The controller 30 determines whether imaging data corresponding to all phase encode steps have been acquired in a k space, for example. When it is determined that all the imaging data have been acquired (No), the controller 30 controls respective parts in such a manner that the scan of the subject continues.

On the other hand, when it is determined that all the imaging data have been acquired (Yes), the scan about the subject is completed as shown in FIG. 10.

Next, the generation of each slice image is done as shown in FIG. 3 (S51).

Here, the image reconstruction unit 31b executes a Fourier transform process on the imaging data acquired so as to the k space by executing the scan section 2 to carry out the scan about each imaging slice area in the imaging sequence, thereby to execute image reconstruction processing, whereby each slice image about the imaging slice area is reconstructed. The image reconstruction unit 31b outputs the reconstructed image to the display unit 33.

In the present embodiment as described above, the imaging sequence condition is adjusted starting with the frequency of each RF pulse, based on the slice tracking method in such a manner that the scan is executed with respect to the imaging slice areas moved at the distances D from the reference position in the imaging sequence IS. When the RF pulse subsequent to having been adjusted in frequency is transmitted upon execution of the scan in the imaging sequence IS, the phase difference Y(D) at which the phase of each magnetic resonance signal changes in each of the imaging slice areas moved at the distances D from the reference position, is calculated using the function f(d) indicative of the relationship between the distance d shifted from the reference position and the phase difference Y(d) produced upon its shift. The phase of the RF pulse transmitted under the imaging sequence condition is adjusted and set based on the calculated phase difference Y(D). That is, the phase of the RF pulse is also adjusted in such a manner that the phase difference in the magnetic resonance signal produced by adjusting the frequency of the RF pulse transmitted in the imaging sequence IS is eliminated, based on the slice tracking method. The scan is executed on each imaging slice area of the subject in accordance with the imaging sequence corresponding to the imaging sequence condition on which the frequency and phase of the RF pulse have been adjusted. Thereafter, the slice image about the imaging slice area is reconstructed based on the imaging data acquired by the execution of the scan. Here, the execution of the scan in the preparation sequence PS is done before execution of the scan in the imaging sequence to acquire the first preparation data s0(n) and the second preparation data s1(n), s2(n) and s3(n). Described specifically, the RF pulse adjusted in frequency is transmitted in such a manner that the magnetic resonance signals are acquired from the first slice area corresponding to the reference position (d=0) and the second slice areas arranged at the positions (d=1, 2 and 3 mm) different from the first slice area as viewed in the slice-axis direction of the first slice area at the subject. Thus, the magnetic resonance signals produced in the first slice area and the second slice areas are acquired as the first preparation data s0(n) and the second preparation data s1(n), s2(n) and s3(n). The phase difference Y(D) is calculated based on the first preparation data s0(n) and the second preparation data s1(n), s2(n) and s3(n). Described specifically, the function f(d) indicative of the relationship between the distance d shifted from the reference position and the phase difference Y(d) produced upon its shift is calculated based on the fist preparation data s0(n) and the second preparation data s1(n), s2(n) and s3(n). Thereafter, data about the distance (d=D) at which each imaging slice area is moved from the reference position (d=0), is obtained by execution of the navigator sequence NS and substituted into the function f(d), thereby calculating the above phase difference Y(D).

In the present embodiment in this manner, the phase of each RF pulse subsequent to having been adjusted in frequency based on the slice tracking method so as to correspond to the imaging slice area displaced from the reference position in the imaging sequence IS is adjusted so as to eliminate the phase difference in the magnetic resonance signal produced when the RF pulse is transmitted upon execution of the scan in the imaging sequence. Thereafter, the imaging sequence IS is executed at the RF pulse adjusted in phase to acquire the imaging data, and each slice image is reconstructed based on the imaging data. It is, therefore, possible to prevent the occurrence of ghosts in the slice image. Thus, image quality can be enhanced.

In the present embodiment in particular, the scan in the preparation sequence PS is executed before execution of the scan in the imaging sequence IS. Based on the preparation data acquired by the execution of the scan in the preparation sequence PS, the phase of each RF pulse transmitted in the imaging sequence IS is corrected. Thus, since the phase correction of the RF pulse is carried out based on the actually measured data, a delay time at the transmission of the RF pulse, an error in phase and a malfunction of the occurrence of ghosts in each image due to the situation of hardware in addition to above can also be resolved suitably.

Thus, the present embodiment is capable of suppressing the occurrence of ghosts and enhancing image quality.

A second embodiment according to the invention will be explained below.

Figure 12:
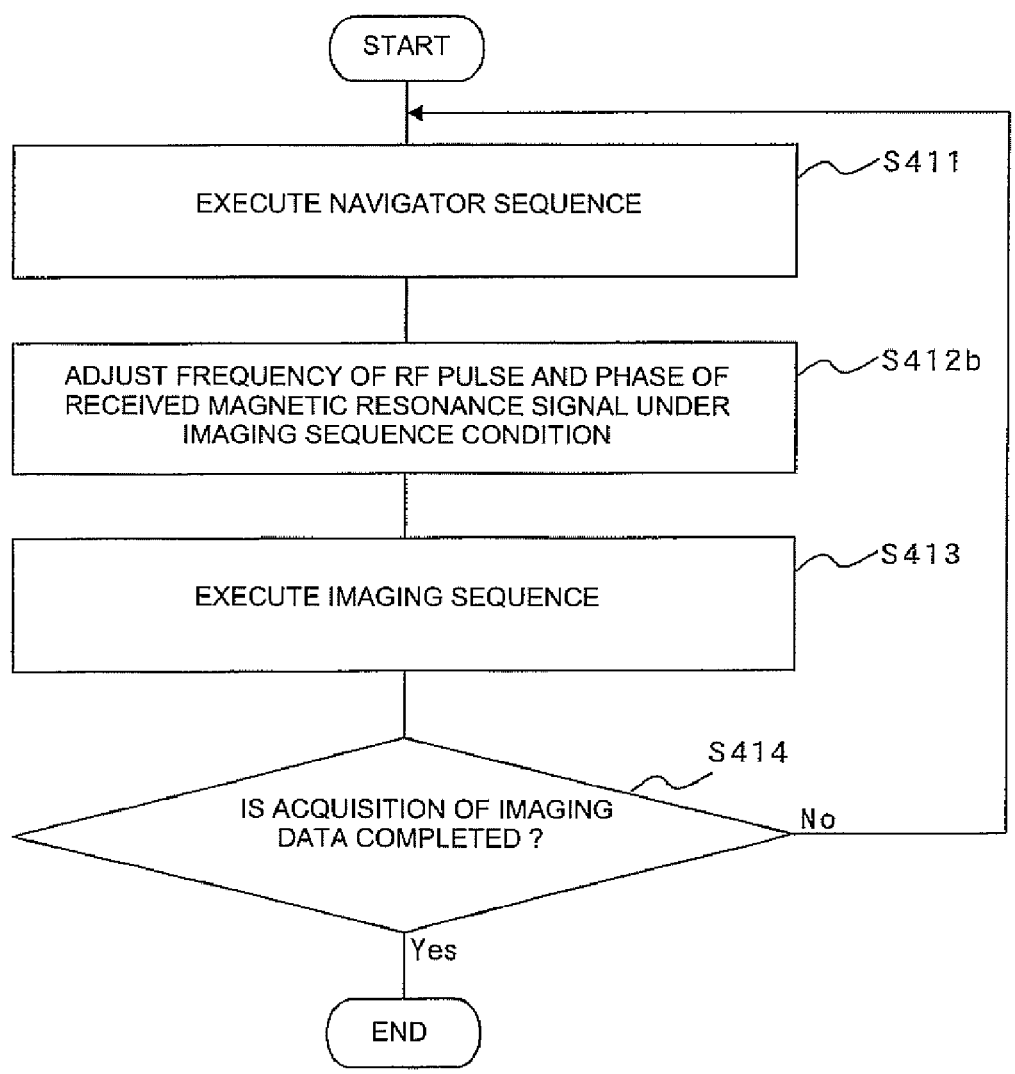
FIG. 12 is a flowchart showing the operation of executing scans in a navigator sequence and an imaging sequence in a second embodiment according to the invention.

FIG. 12 is a flowchart showing the operation of executing scans in a navigator sequence and an imaging sequence in the second embodiment according to the invention.

As shown in FIG. 12, the frequency of each RF pulse and the phase of each received magnetic resonance signal at the setting of the imaging sequence are adjusted in place of Step S412 shown in FIG. 10 (S412b). Except for this point, the present embodiment is similar to the first embodiment. Thus, the description of dual parts will be omitted.

In the present embodiment, the navigator sequence NS is first executed as shown in FIG. 12 (S411).

Here, the navigator sequence NS is executed in a manner similar to the first embodiment.

Next, as shown in FIG. 12, the frequency of the RF pulse and the phase of the received magnetic resonance signal are adjusted under an imaging sequence condition (S412b).

Here, the frequency of each RF pulse transmitted in the imaging sequence is adjusted based on the slice tracking method in a manner similar to the first embodiment.

When the RF pulse subsequent to having been adjusted in frequency so as to the slice tracking method is transmitted upon execution of the scan in the imaging sequence, and each magnetic resonance signal produced in its imaging slice area is received, the corresponding imaging sequence condition setting unit 301 adjusts and sets the imaging sequence condition in such a manner that a phase difference at which the phase of the received magnetic resonance signal is changed, is eliminated. That is, the imaging sequence condition is adjusted to receive each magnetic resonance signal produced by transmission of the RF pulse subsequent to having been adjusted in frequency by the slice tracking method, in such a manner that the phase of the corresponding magnetic resonance signal produced in the imaging slice area moved from a reference position when the RF pulse subsequent to having been adjusted in frequency from a reference frequency so as to correspond to the imaging slice area in which an imaging target is displaced from the reference position due to body motion, is transmitted upon execution of each scan in the imaging sequence, and the phase of the corresponding magnetic resonance signal produced in the imaging slice area lying in the reference position when the RF pulse is transmitted at the reference frequency upon execution of each scan in the imaging sequence, are identical to each other and a phase difference produced between both phases is eliminated.

In the present embodiment as described above, upon execution of the imaging sequence for transmitting the RF pulse adjusted in frequency by the slice tracking method, so as to acquire imaging data from the corresponding imaging slice area moved to another position as viewed in a slice-axis direction at a distance (d=D) from the reference position (d=0), the phases of the magnetic resonance signals received as the imaging data are adjusted based on a phase difference $Y(D)$ calculated using a function $f(d)$ in a manner similar to the first embodiment, followed by being acquired. For example, the phase of each magnetic resonance signal acquired upon execution of the imaging sequence IS for transmitting the RF pulse subsequent to having been adjusted in frequency as described above is adjusted so as to shift in association with the phase difference $Y(D)$ calculated in the above-described manner, whereby it is received.

Described specifically, the adjusted frequency is set to its corresponding RF driver 22. A phase obtained by adding the calculated phase difference $Y(D)$ to each received phase set upon imaging the reference position is set to its corresponding data acquisition unit 24.

Next, as shown in FIG. 12, the execution of the imaging sequence IS (S413) and determination as to the completion of acquisition of the imaging data (S414) are done.

Here, the operations at respective Steps are carried out in a manner similar to the first embodiment, and the execution of the scan in the imaging sequence IS is completed.

In the present embodiment as described above, the phase of each magnetic resonance signal is received by its adjustment in such a manner that the phase difference in magnetic resonance signal produced upon transmission of each RF pulse subsequent to having been adjusted in frequency by the slice tracking method upon execution of the scan in the imaging sequence, thereby acquiring the imaging data. Each slice image is reconstructed based on the imaging data. It is, therefore, possible to prevent the occurrence of ghosts in the slice image. Thus, image quality can be enhanced.

A third embodiment according to the invention will be explained below.

Figure 13:
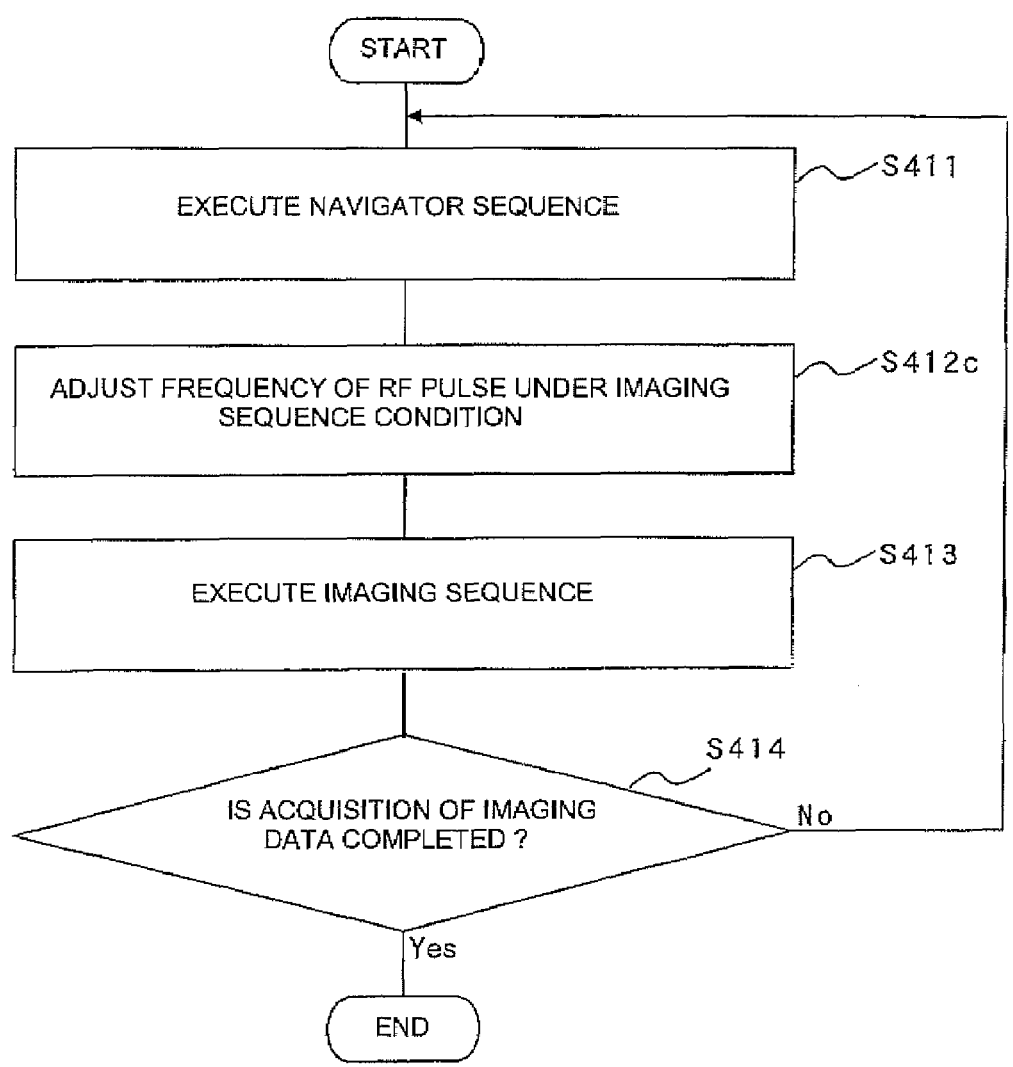
FIG. 13 is a flowchart showing the operation of executing scans in a navigator sequence and an imaging sequence in a third embodiment according to the invention.

FIG. 13 is a flowchart showing the operation of executing scans in a navigator sequence and an imaging sequence in the third embodiment according to the invention.

The frequency of each RF pulse is adjusted under an imaging sequence condition in place of Step S412 shown in FIG. 10 (S412c). That is, the phase of the RF pulse is not adjusted unlike the first embodiment. However, in the present embodiment in addition to it, the phase of each imaging data defined as raw data upon the image reconstruction processing at Step S51 shown in FIG. 3 is adjusted and thereafter the image reconstruction processing is effected on the post-phase adjustment imaging data. Except for this point, the present embodiment is similar to the first embodiment. Accordingly, the description of dual parts will be omitted.

In the present embodiment, the navigator sequence NS is first executed as shown in FIG. 13 (S411).

Here, the navigator sequence NS is executed in a manner similar to the first embodiment.

Next, as shown in FIG. 13, the frequency of the RF pulse is adjusted under the imaging sequence condition (S412c).

Here, the frequency of each RF pulse transmitted in the imaging sequence IS is adjusted based on the slice tracking method in a manner similar to the first embodiment.

Next, as shown in FIG. 13, the execution of the imaging sequence IS (S413) and determination as to the completion of acquisition of the imaging data (S414) are done.

Here, the operations at respective Steps are carried out in a manner similar to the first embodiment, and the execution of the scan in the imaging sequence IS is completed.

In the present embodiment, upon acquisition of the imaging data by the execution of the scan in the imaging sequence IS, the imaging data are acquired and stored with the imaging data acquired from imaging slices moved from a reference position to other positions and distances D at which the imaging slice areas are moved from the reference position, being associated with one another.

Thus, Steps shown in FIG. 13 are sequentially executed, thereby completing Step S41 for executing the scans based on the navigator sequence and the imaging sequence, which is shown in FIG. 3.

As shown in FIG. 3, the generation of each slice image is executed (S51).

Here, the controller 30 controls the operation of the image reconstruction unit 31b in such a manner that the image reconstruction unit 31b corrects the phase of each imaging data based on a phase difference $Y(D)$ calculated by the phase difference calculation unit 302 in a manner similar to the first embodiment. Thereafter, the controller 30 controls the operation of the image reconstruction unit 31b in such a manner that image reconstruction processing is executed on the imaging data adjusted in phase.

Described specifically, in a manner similar to the first embodiment, the phase difference calculation unit 302 calculates a phase difference $Y(D)$ at which the phase of each magnetic resonance signal produced in an imaging slice area moved in a slice-axis direction at the distance (d=D) from the reference position changes, when the RF pulse adjusted in frequency based on the slice tracking method is transmitted upon execution of the scan in the imaging sequence. Here, a distance D at which the position of each imaging slice area including an imaging target displaced with the motion of a diaphragm is moved in the slice-axis direction from the reference position is determined based on the result of determination of the moved position of diaphragm by the position detection unit 31a upon execution of each imaging sequence. Thereafter, a phase difference Y(D) is calculated by substituting the calculated distance (d=D) into a function f(d) indicative of a relationship between a distance d shifted from the reference position and a phase difference Y(d) produced upon its shift. Here, this processing is executed in such a manner that the phase differences Y(D) are calculated with respect to the respective imaging data acquired by execution of the imaging sequences.

For instance, the phases of the respective magnetic resonance signals acquired as the imaging data upon execution of the respective imaging sequences IS for transmitting the RF pulses subsequent to having been adjusted in frequency as described above are corrected by being shifted in association with the phase differences Y(D) calculated as described above.

Described specifically, the phase differences Y(D) at the acquisition of data in respective k spaces are stored in the storage unit 34. Before the execution of image reconstruction, the image reconstruction unit 31b reads the phase difference Y(D) in each k space from the storage unit 34 to shift the phase.

The image reconstruction unit 31b executes a Fourier transform process on the imaging data adjusted and corrected in phase as described above thereby to execute image reconstruction processing, whereby a slice image about each imaging slice area is reconstructed. The image reconstruction unit 31b outputs the reconstructed image to the display unit 33.

In the present embodiment as described above, upon execution of the scan in the imaging sequence, the phase of each of the magnetic resonance signals acquired as the imaging data is corrected in such a manner that the phase difference in the magnetic resonance signal produced when the RF pulse subsequent to having been adjusted in frequency by the slice tracking method is transmitted, is eliminated. Each slice image is reconstructed based on the imaging data corrected in phase. It is, therefore, possible to prevent the occurrence of ghosts in the reconstructed slice image. Thus, image quality can be enhanced.

Incidentally, the magnetic resonance imaging apparatus 1 according to the above embodiment corresponds to a magnetic resonance imaging apparatus of the invention. The scan section 2 of the above embodiment is equivalent to a scan section of the invention. The position detection unit 31a of the above embodiment corresponds to a position detection unit of the invention. The image reconstruction unit 31b of the above embodiment corresponds to an image reconstruction unit of the invention. The imaging sequence condition setting unit 301 of the above embodiment corresponds to an imaging sequence condition setting unit of the invention. The preparation sequence condition setting unit 301b of the above embodiment is equivalent to a preparation sequence condition setting unit of the invention. The phase difference calculation unit 302 of the above embodiment corresponds to a phase difference calculation unit of the invention.

The invention is not limited to the above embodiments upon implementation of the invention. Various modifications can be adopted.

For example, the scan based on the imaging sequence may be applied when three-dimensional imaging is executed. In this case, the preparation sequence condition is set in such a manner that the gradient pulse for performing phase-encoding in the slice-axis direction is not transmitted either upon execution of the scan in the preparation sequence.

As to each imaging position at the execution of the scan in the preparation sequence, it may be the same position as that for the scan in the imaging sequence or may be a position different therefrom. The number of slices may be one or plural.

Upon calculation of the function indicative of the relationship between the distance shifted from the reference position and the phase difference produced upon its shift, the function may be calculated as a multidimensional function. Alternatively, the average value per the amount of shift of preparation data obtained in the preparation sequence is calculated and the calculation of the function may be executed using the average value. Here, the influence of field ununiformity may change due to a change in excitation position, or a material ratio (ratio between water and fat) of a targeted organ may change. Therefore, data that greatly deviates from the average value may be set so as to avoid its use. When the data is greatly different from a theoretical value or a predicted value based on an actually measured value obtained by uniform phantom in advance, it may be set so as to avoid its use.

Upon execution of the navigator sequence, for example, various scanning or imaging methods such as a 2D selection excitation type, etc. in addition to the spin echo method may be carried out.

For instance, the detection of body motion of the subject is not limited to the execution of the navigator sequence upon its detection. As to the breathing exercise of the subject, it may be detected by, for example, winding a belt on the chest region of the subject and detecting expansion and contraction of the belt.

Although the present embodiment has described, for example, the case in which the scan is executed in sync with an electrocardiac signal, it may, as a matter of course, be applied even to a case in which the scan is not synchronized with the electrocardiac signal.

Although the present embodiment has described, for example, the case in which the preparation sequence condition is set in such a manner that the navigation sequence for acquiring the magnetic resonance signals produced in the area including the diaphragm at the subject, as the navigator echo data is contained in the preparation sequence for scanning the first slice area and the second slice areas, and the scan is executed efficiently, the invention is not limited to it. The navigation sequence may obviously be applied even to a case in which it is executed so as not to be contained in the preparation sequence.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus comprising:
    a scan section comprising a static magnetic field space in which imaging slice areas each including an imaging target body-moved at a subject are accommodated, said scan section configured to scan the subject in accordance with an imaging sequence for applying RF pulses to the imaging slice areas accommodated in the static magnetic field space to acquire magnetic resonance signals produced from the imaging slice areas as imaging data;
    an image reconstruction unit configured to execute image reconstruction processing on the imaging data acquired by allowing said scan section to execute the scan in the imaging sequence, thereby reconstructing images of the imaging slice areas;

a position calculation unit configured to determine a position where the imaging target is body-moved; and a controller configured to control operations of said scan section and said image reconstruction unit based on the position of the imaging target, which is determined by said position calculation unit, said controller comprises:

an imaging sequence condition setting unit configured to set an imaging sequence condition at the time said scan section executes the scan in the imaging sequence, the imaging sequence set to correspond to a slice tracking method for adjusting at least a frequency of each RF pulse applied in the imaging sequence, the imaging sequence based on the position of the imaging target calculated by said position calculation unit, thereby changing the position of said each imaging slice area such that the imaging data are acquired from the body-moved imaging target when the scan section executes the scan in the imaging sequence; and a phase difference calculation unit configured to calculate a phase difference at which phases of the magnetic resonance signals produced in the imaging slice areas change, when the RF pulse subsequent to having been adjusted in frequency so as to correspond to the position of the imaging target by said imaging sequence condition setting unit is transmitted upon execution of the scan in the imaging sequence, wherein said controller is configured to control the operation of said scan section such that said scan section executes the scan in the imaging sequence based on the imaging sequence condition set so as to correspond to the slice tracking method by the imaging sequence condition setting unit, said controller is further configured to control the operation of at least one of said scan section and said image reconstruction unit based on the phase difference calculated by said phase difference calculation unit so as to eliminate the phase difference at which the phases of the magnetic resonance signals produced in the imaging slice areas change, when the RF pulse subsequent to having been adjusted in frequency so as to the slice tracking method is transmitted upon execution of the scan in the imaging sequence.

2. The magnetic resonance imaging apparatus according to claim 1, wherein said controller further comprises a preparation sequence condition setting unit configured to set a preparation sequence condition at which said scan section executes a preparation sequence such that execution of scans in the preparation sequence including a first preparation sequence for transmitting an RF pulse to a first slice area of the subject at a first frequency in the static magnetic field space and acquiring a magnetic resonance signal produced from the first slice area as first preparation data, and a second preparation sequence for transmitting an RF pulse of a second frequency different from the first frequency so as to acquire a magnetic resonance signal from a second slice area located at a position different from the first slice area as viewed in a slice-axis direction of the first slice area at the subject and acquiring the magnetic resonance signal produced from the second slice area as second preparation data is performed before the execution of the scan in the imaging sequence, wherein said controller is configured to control the operation of said scan section such that the subject is scanned by execution of the preparation sequence by said scan section based on the preparation sequence condition set by said preparation sequence condition setting unit, and wherein said phase difference calculation unit calculates the phase difference based on the first preparation data and the second preparation data respectively acquired by allowing said scan section to execute the scans.

3. The magnetic resonance imaging apparatus according to claim 1, wherein said imaging sequence condition setting unit is configured to set the imaging sequence condition based on the phase difference calculated by said phase difference calculation unit in such a way as to eliminate a phase difference at which the phase of the magnetic resonance signal produced in said each imaging slice area changes, when the RF pulse subsequent to having been adjusted in frequency so as to correspond to the slice tracking method is transmitted upon execution of the scan in the imaging sequence.

4. The magnetic resonance imaging apparatus according to claim 3, wherein when the imaging sequence condition is set, said imaging sequence condition setting unit is configured to adjust the phase of each RF pulse transmitted upon execution of the imaging sequence, the phase of each RF pulse adjusted based on the phase difference calculated by said phase difference calculation unit.

5. The magnetic resonance imaging apparatus according to claim 3, wherein said imaging sequence condition setting unit is configured to set the imaging sequence condition in such a manner that said scan section adjusts the phase of the imaging data and acquires the so-adjusted imaging data upon execution of the imaging sequence, the phase of the imaging data adjusted based on the phase difference calculated by the phase difference calculation unit.

6. The magnetic resonance imaging apparatus according to claim 1, wherein after said image reconstruction unit corrects the phase of the imaging data based on the phase difference calculated by said phase difference calculation unit so as to eliminate the phase difference at which the phase of each magnetic resonance signal acquired when the RF pulse subsequent to having been adjusted in frequency so as to correspond to the slice tracking method is transmitted upon execution of the scan in the imaging sequence changes, said controller is configured to control the operation of said image reconstruction unit to execute the image reconstruction processing.

7. The magnetic resonance imaging apparatus according to claim 1, wherein said position calculation unit is configured to calculate the position of the imaging target body-moved by a breathing exercise of the subject.

8. The magnetic resonance imaging apparatus according to claim 7, wherein said preparation sequence condition setting unit is configured to set the preparation sequence condition in such a manner that a navigation sequence for acquiring magnetic resonance signals produced in an area containing a diaphragm at the subject as navigator echo data is contained in the preparation sequence, and wherein said position calculation unit is configured to calculate the position of the imaging target based on the navigator echo data acquired by allowing said scan section to scan the subject in accordance with the preparation sequence corresponding to the preparation sequence condition set by said preparation sequence condition setting unit.

9. The magnetic resonance imaging apparatus according to claim 1, wherein said preparation sequence condition setting unit is configured to set the preparation sequence condition in such a manner that a pulse sequence free of transmission of a phase encode gradient pulse is brought to the preparation sequence at the imaging sequence set by said imaging sequence condition setting unit.

10. The magnetic resonance imaging apparatus according to claim 9, wherein said preparation sequence condition setting unit is configured to set the preparation sequence condition in such a manner that the magnetic resonance signals are respectively acquired from a plurality of the second slice areas different in position as viewed in the slice-axis direction of the first slice area at the subject as the second preparation data in the second preparation sequence.

11. The magnetic resonance imaging apparatus according to claim 9, wherein said phase difference calculation unit is configured to execute a one-dimensional Fourier transform process on the first preparation data and the second preparation data thereby to calculate projection images of the first slice areas and the second slice areas and calculates the phase difference based on phases of the calculated projection images.

12. A magnetic resonance imaging method which scans a subject in accordance with an imaging sequence for applying RF pulses to imaging slice areas each including an imaging target body-moved at the subject in a static magnetic field space in which the imaging slice areas are accommodated, and acquiring magnetic resonance signals produced from the imaging slice areas as imaging data, and thereafter executes image reconstruction processing on the imaging data acquired by execution of the scan in the imaging sequence, thereby reconstructing images of the imaging slice areas, said magnetic resonance imaging method comprising:

setting a preparation sequence condition at execution of a preparation sequence in such a manner that execution of scans in the preparation sequence including a first preparation sequence for transmitting an RF pulse to a first slice area of the subject at a first frequency in the static magnetic field space and acquiring a magnetic resonance signal produced from the first slice area as first preparation data, and a second preparation sequence for transmitting an RF pulse of a second frequency different from the first frequency so as to acquire a magnetic resonance signal from a second slice area located at a position different from the first slice area as viewed in a slice-axis direction of the first slice area at the subject and acquiring the magnetic resonance signal produced from the second slice area as second preparation data is performed before the execution of the scan in the imaging sequence;

determining a position where the imaging target is body-moved; and setting an imaging sequence condition at the time that the scan is executed in the imaging sequence so as to correspond to a slice tracking method for adjusting at least the frequency of each RF pulse applied in the imaging sequence, the imaging sequence condition set based on the position of the imaging target calculated by the position calculation step and thereby changing the position of each imaging slice area in such a manner that the imaging data are acquired from the body-moved imaging target when the scan is executed in the imaging sequence, wherein the phase difference of the magnetic resonance signals produced in the imaging slice areas is calculated based on the first preparation data and the second preparation data acquired by execution of the scan in the imaging sequence, when the RF pulse subsequent to having been adjusted in frequency so as to correspond to the slice tracking method is transmitted upon execution of the scan in the imaging sequence, and wherein the imaging sequence condition is set based on the calculated phase difference so as to eliminate the phase difference at which the phases of the magnetic resonance signals produced in the imaging slice areas change, when the RF pulse subsequent to having been adjusted in frequency is transmitted upon execution of the scan in the imaging sequence.

13. The magnetic resonance imaging method according to claim 12, wherein setting the imaging sequence condition comprises adjusting the phase of each RF pulse transmitted upon execution of the imaging sequence based on the calculated phase difference when the imaging sequence condition is set.

14. The magnetic resonance imaging method according to claim 12, wherein setting the imaging sequence condition comprises setting the imaging sequence condition based on the calculated phase difference in such a manner that upon execution of the imaging sequence, the phase of the imaging data is adjusted and the so-adjusted imaging data is acquired.

15. The magnetic resonance imaging method according to claim 12, wherein determining a position where the imaging target is body-moved comprises determining the position of the imaging target body-moved by a breathing exercise of the subject.

16. The magnetic resonance imaging method according to claim 15,
wherein setting the preparation sequence condition comprises setting the preparation sequence condition in such a manner that a navigation sequence for acquiring magnetic resonance signals produced in an area containing a diaphragm at the subject as navigator echo data is contained in the preparation sequence, and
wherein determining a position where the imaging target is body-moved further comprises determining the position of the imaging target based on the navigator echo data acquired by scanning the subject in accordance with the preparation sequence corresponding to the preparation sequence condition.

17. The magnetic resonance imaging method according to claim 12, wherein setting the preparation sequence condition comprises setting the preparation sequence condition in such a manner that a pulse sequence free of transmission of a phase encode gradient pulse is brought to the preparation sequence at the imaging sequence.

18. The magnetic resonance imaging method according to claim 17, wherein setting the preparation sequence condition further comprises setting the preparation sequence condition in such a manner that the magnetic resonance signals are respectively acquired, as the second preparation data, from a plurality of the second slice areas different in position as viewed in the slice-axis direction of the first slice area at the subject in the second preparation sequence.

19. The magnetic resonance imaging method according to claim 17, wherein calculating the phase difference comprises executing a one-dimensional Fourier transform process on the first preparation data and the second preparation data to calculate projection images of the first and second slice areas, and the phase difference is calculated based on the phases of the calculated projection images.

20. A magnetic resonance imaging method which scans a subject in accordance with an imaging sequence for applying RF pulses to imaging slice areas each including an imaging target body-moved at the subject, in a static magnetic field space in which the imaging slice areas are accommodated, and acquiring magnetic resonance signals produced from the imaging slice areas as imaging data, and thereafter executes image reconstruction processing on the imaging data acquired by execution of the scan in the imaging sequence, thereby reconstructing images of the imaging slice areas, said magnetic resonance imaging method comprising:

setting a preparation sequence condition at execution of a preparation sequence in such a manner that execution of scans in the preparation sequence including a first preparation sequence for transmitting an RF pulse to a first slice area of the subject at a first frequency in the static magnetic field space and acquiring a magnetic resonance signal produced from the first slice area as first preparation data, and a second preparation sequence for transmitting an RF pulse of a second frequency different from the first frequency so as to acquire a magnetic resonance signal from a second slice area located at a position different from the first slice area as viewed in a slice-axis direction of the first slice area at the subject and acquiring the magnetic resonance signal produced from the second slice area as second preparation data is performed before the execution of the scan in the imaging sequence;

determining a position where the imaging target is body-moved;

setting an imaging sequence condition at the time that the scan is executed in the imaging sequence, so as to correspond to a slice tracking method for adjusting at least the frequency of each RF pulse applied in the imaging sequence, based on the position of the imaging target calculated by the position calculation step and thereby changing the position of said each imaging slice area, in such a manner that the imaging data are acquired from the body-moved imaging target when the scan is executed in the imaging sequence; and performing image reconstruction processing on the imaging data acquired by the scan executed on the subject in the imaging sequence corresponding to the imaging sequence condition thereby reconstructing images of the imaging slice areas, correcting the phase of the imaging data based on the calculated phase difference to eliminate the phase difference at which the phase of each magnetic resonance signal acquired when the RF pulse subsequent to having been adjusted in frequency so as to correspond to the slice tracking method is transmitted upon execution of the scan in the imaging sequence, changes, and thereafter the image reconstruction processing is executed.

* * * * *